United States Patent
Yamazaki et al.

(10) Patent No.: US 8,901,552 B2
(45) Date of Patent: Dec. 2, 2014

(54) TOP GATE THIN FILM TRANSISTOR WITH MULTIPLE OXIDE SEMICONDUCTOR LAYERS

(75) Inventors: Shunpei Yamazaki, Setagaya (JP); Yusuke Nonaka, Atsugi (JP); Takayuki Inoue, Isehara (JP); Masashi Tsubuku, Atsugi (JP); Kengo Akimoto, Atsugi (JP); Akiharu Miyanaga, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/226,713

(22) Filed: Sep. 7, 2011

(65) Prior Publication Data
US 2012/0061663 A1    Mar. 15, 2012

(30) Foreign Application Priority Data

Sep. 13, 2010   (JP) .................. 2010-204968

(51) Int. Cl.
| | |
|---|---|
| H01L 29/12 | (2006.01) |
| H01L 29/04 | (2006.01) |
| H01L 31/036 | (2006.01) |
| H01L 31/0376 | (2006.01) |
| H01L 31/20 | (2006.01) |
| H01L 27/01 | (2006.01) |
| H01L 27/12 | (2006.01) |
| H01L 21/02 | (2006.01) |
| H01L 29/786 | (2006.01) |

(52) U.S. Cl.
CPC ...... *H01L 29/7869* (2013.01); *H01L 21/02488* (2013.01); *H01L 21/02565* (2013.01); *H01L 21/02554* (2013.01)
USPC ........ 257/43; 257/59; 257/347; 257/E21.459; 257/E29.068

(58) Field of Classification Search
CPC ......... H01L 21/34; H01L 29/12; H01L 29/24; H01L 21/02488; H01L 21/02565; H01L 21/02554; H01L 29/7869
USPC .............. 257/43, 59, 347, E21.459, E29.068; 438/104, 151, 158
See application file for complete search history.

(56) References Cited

U.S. PATENT DOCUMENTS

| | | | |
|---|---|---|---|
| 5,528,032 A | | 6/1996 | Uchiyama |
| 5,626,715 A | * | 5/1997 | Rostoker ........................ 438/4 |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Toshio Kamiya et al., "Carrier transport properties and electronic structures of amorphous oxide semiconductors: the present status,", Solid State Physics, Sep. 1, 2009, vol. 44, No. 9, pp. 621-633, AGNE GIJUTSU Center.

(Continued)

*Primary Examiner* — David S Blum
(74) *Attorney, Agent, or Firm* — Eric J. Robinson; Robinson Intellectual Property Law Office, P.C.

(57) ABSTRACT

An object is to provide a semiconductor device including an oxide semiconductor film, which has stable electrical characteristics and high reliability. A stack of first and second material films is formed by forming the first material film (a film having a hexagonal crystal structure) having a thickness of 1 nm to 10 nm over an insulating surface and forming the second material film having a hexagonal crystal structure (a crystalline oxide semiconductor film) using the first material film as a nucleus. As the first material film, a material film having a wurtzite crystal structure (e.g., gallium nitride or aluminum nitride) or a material film having a corundum crystal structure ($\alpha$-$Al_2O_3$, $\alpha$-$Ga_2O_3$, $In_2O_3$, $Ti_2O_3$, $V_2O_3$, $Cr_2O_3$, or $\alpha$-$Fe_2O_3$) is used.

20 Claims, 20 Drawing Sheets

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1* | 1/2005 | Hoffman ................. 257/347 |
| 2005/0074963 A1 | 4/2005 | Fujii et al. |
| 2005/0199959 A1 | 9/2005 | Chiang et al. |
| 2005/0199961 A1* | 9/2005 | Hoffman et al. ............ 257/368 |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1* | 5/2006 | Yabuta et al. ............... 438/151 |
| 2006/0113536 A1 | 6/2006 | Kumomi et al. |
| 2006/0113539 A1* | 6/2006 | Sano et al. ................. 257/59 |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1* | 8/2006 | Isa et al. ................... 257/775 |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1* | 5/2007 | Akimoto ................... 257/61 |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0241327 A1* | 10/2007 | Kim et al. ................. 257/43 |
| 2007/0252928 A1 | 11/2007 | Ito et al. |
| 2007/0272922 A1* | 11/2007 | Kim et al. ................. 257/43 |
| 2007/0287221 A1 | 12/2007 | Ong et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0197350 A1* | 8/2008 | Park et al. ................. 257/43 |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0027580 A1* | 1/2009 | Kurokawa et al. ............ 349/43 |
| 2009/0045399 A1* | 2/2009 | Kaji et al. ................. 257/43 |
| 2009/0068773 A1 | 3/2009 | Lai et al. |
| 2009/0072232 A1* | 3/2009 | Hayashi et al. ............... 257/43 |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0184315 A1 | 7/2009 | Lee et al. |
| 2009/0242881 A1* | 10/2009 | Yoon et al. ................. 257/43 |
| 2009/0267068 A1* | 10/2009 | Dairiki et al. ................ 257/57 |
| 2009/0278122 A1 | 11/2009 | Hosono et al. |
| 2009/0278125 A1* | 11/2009 | Duan et al. ................. 257/49 |
| 2009/0280600 A1 | 11/2009 | Hosono et al. |
| 2009/0321732 A1* | 12/2009 | Kim et al. ................. 257/43 |
| 2010/0025678 A1* | 2/2010 | Yamazaki et al. ............ 257/43 |
| 2010/0032665 A1* | 2/2010 | Yamazaki et al. ............ 257/43 |
| 2010/0051949 A1 | 3/2010 | Yamazaki et al. |
| 2010/0065844 A1 | 3/2010 | Tokunaga |
| 2010/0072468 A1* | 3/2010 | Yamazaki et al. ............ 257/43 |
| 2010/0092800 A1 | 4/2010 | Itagaki et al. |
| 2010/0102397 A1* | 4/2010 | Park et al. ................. 257/392 |
| 2010/0105162 A1* | 4/2010 | Suzawa et al. ............... 438/104 |
| 2010/0109002 A1 | 5/2010 | Itagaki et al. |
| 2010/0109003 A1* | 5/2010 | Akimoto et al. ............. 257/43 |
| 2010/0117074 A1* | 5/2010 | Yamazaki et al. ............ 257/43 |
| 2010/0117075 A1* | 5/2010 | Akimoto et al. ............. 257/43 |
| 2010/0163868 A1* | 7/2010 | Yamazaki et al. ............ 257/43 |
| 2010/0181565 A1* | 7/2010 | Sakata et al. ............... 257/43 |
| 2010/0203673 A1 | 8/2010 | Hayashi et al. ............. 438/104 |
| 2010/0219410 A1* | 9/2010 | Godo et al. ................. 257/43 |
| 2010/0295037 A1* | 11/2010 | Hironaka ................... 257/43 |
| 2011/0006368 A1* | 1/2011 | Hata et al. ................. 257/347 |
| 2011/0133180 A1 | 6/2011 | Yamazaki |
| 2011/0147734 A1* | 6/2011 | Kim et al. ................. 257/43 |
| 2011/0147739 A1 | 6/2011 | Yamazaki et al. |
| 2011/0151618 A1 | 6/2011 | Yamazaki et al. |
| 2011/0156022 A1* | 6/2011 | Yamazaki et al. ............ 257/43 |
| 2011/0156026 A1 | 6/2011 | Yamazaki et al. |
| 2011/0163309 A1* | 7/2011 | Choi et al. ................. 257/43 |
| 2011/0284848 A1 | 11/2011 | Yamazaki |
| 2012/0064664 A1 | 3/2012 | Yamazaki et al. |
| 2012/0132907 A1 | 5/2012 | Yamazaki et al. |
| 2012/0241735 A1 | 9/2012 | Honda et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-026119 | 1/2000 |
| JP | 2000-044236 A | 2/2000 |
| JP | 2000-150900 A | 5/2000 |
| JP | 2002-076356 A | 3/2002 |
| JP | 3298974 | 7/2002 |

(56) References Cited

FOREIGN PATENT DOCUMENTS

| JP | 2002-289859 A | 10/2002 |
|---|---|---|
| JP | 2003-086000 A | 3/2003 |
| JP | 2003-086808 A | 3/2003 |
| JP | 2003-298062 | 10/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2008-108985 A | 5/2008 |
| JP | 2010-040552 | 2/2010 |
| JP | 2010-135766 A | 6/2010 |
| JP | 2010-177431 | 8/2010 |
| JP | 2010-177431 A | 8/2010 |
| WO | WO-2004/114391 | 12/2004 |

OTHER PUBLICATIONS

Jeong.Y et al., "Bias-Stress-Stable Solution-Processed Oxide Thin Film Transistors,", ACS Applied Materials & Interfaces, Feb. 26, 2010, vol. 2, No. 3, pp. 611-615.

Fortunato.E et al., "Wide-Bandgap High-Mobility Zno Thin-Film Transistors Produced At Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of Igzo Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350°C,", Journal of Solid State Chemistry, Aug. 1, 1991, vol. 93, No. 2, pp. 298-315.

Kimizuka.n et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous Gizo (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMCLD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase", ", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5) Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09: Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

(56) References Cited

OTHER PUBLICATIONS

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure For Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel, YBFE2O4, and YB2FE3O7 Types of Structures for Compounds in the IN2O3 and SC2O3-A2O3-BO Systems [A; FE, GA, OR, AL; B: MG, MN, FE, NI, CU, OR ZN] at Temperatures Over 1000°C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", JPN. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214TH ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of Zno Thin-Film Transistors With Aluminum Oxide Dielectric Layers,", J. Electrochem. Soc. (Journal of the Electrochemical Society), 2008, vol. 155, No. 12, H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Nomura.K et al., "Growth mechanism for single-crystalline thin film of InGaO3(ZnO)5 by reactive solid-phase epitaxy,", J. Appl. Phys. (Journal of Applied Physics ), May 15, 2004, vol. 95, No. 10, pp. 5532-5539.

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008.

\* cited by examiner

Ga、Al    O、N

● In, Al, Ga, Ti, V, Cr, Fe

○ O

TOP GATE THIN FILM TRANSISTOR WITH MULTIPLE OXIDE SEMICONDUCTOR LAYERS

BACKGROUND OF THE INVENTION

1. Field of the Invention

An embodiment of the present invention relates to a semiconductor device including an oxide semiconductor and a method for manufacturing the semiconductor device.

In this specification, a semiconductor device generally means a device which can function by utilizing semiconductor characteristics, and an electro-optical device, a semiconductor circuit, and an electronic device are all semiconductor devices.

2. Description of the Related Art

In recent years, a technique for forming a thin film transistor (TFT) using a semiconductor thin film (having a thickness of about several tens of nanometers to several hundred nanometers) formed over a substrate having an insulating surface has attracted attention. Thin film transistors are applied to a wide range of electronic devices such as ICs or electro-optical devices, and thin film transistors that are used as switching elements in image display devices are particularly being developed urgently. There are various kinds of metal oxides, which are used for a wide range of applications.

Some metal oxides have semiconductor characteristics. Examples of such metal oxides having semiconductor characteristics include tungsten oxide, tin oxide, indium oxide, and zinc oxide. Thin film transistors in each of which such a metal oxide having semiconductor characteristics is used for a channel formation region have already been known (Patent Documents 1 and 2).

As for an oxide semiconductor used in such a transistor, there is description as follows: an oxide semiconductor is insensitive to impurities; there is no problem when a considerable amount of metal impurities is contained in the film; and soda-lime glass which contains a large amount of alkali metal such as sodium and is inexpensive can also be used (see Non-Patent Document 1).

REFERENCE

[Patent Document 1] Japanese Published Patent Application No. 2007-123861
[Patent Document 2] Japanese Published Patent Application No. 2007-96055
[Non-Patent Document 1] Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633

SUMMARY OF THE INVENTION

When hydrogen or water, which forms an electron donor, enters an oxide semiconductor in a process for manufacturing a device, the electrical conductivity of the oxide semiconductor may change. Such a phenomenon becomes a factor of change in the electrical characteristics of a transistor including an oxide semiconductor.

Further, the electrical characteristics of a semiconductor device including an oxide semiconductor may change by irradiation with visible light or ultraviolet light.

In view of the above problems, one object is to provide a semiconductor device including an oxide semiconductor film, which has stable electrical characteristics and high reliability.

Another object is to provide a manufacturing process of a semiconductor device, which realizes mass production of highly reliable semiconductor devices by using a large-sized substrate such as a mother glass.

One embodiment of the disclosed invention is a method for manufacturing a semiconductor device, including the steps of forming a first material film (a film having a hexagonal crystal structure) over an insulating surface and forming a second material film having a hexagonal crystal structure (a crystalline oxide semiconductor film) using the first material film as a nucleus, thereby forming a stack of the first material film and the second material film. Note that the first material film and the second material film are formed using different materials.

Specifically, as the first material film, a material film having a wurtzite crystal structure (e.g., gallium nitride or aluminum nitride) or a material film having a corundum crystal structure ($\alpha$-$Al_2O_3$, $\alpha$-$Ga_2O_3$, $In_2O_3$, $Ti_2O_3$, $V_2O_3$, $Cr_2O_3$, or $\alpha$-$Fe_2O_3$) can be used. In order to obtain a favorable crystal structure, a stack of these material films may be used; for example, a stack of an aluminum nitride film and a gallium nitride film thereover may be used.

Note that a wurtzite crystal structure is one of crystal structures which are observed in ionic crystals of cations and anions bound at 1:1. FIGS. 6A and 6B illustrate a wurtzite crystal structure; black circles represent gallium or aluminum, and white circles represent oxygen. FIG. 6A is a schematic diagram of a wurtzite crystal structure in the a-b plane, and FIG. 6B is a schematic diagram of a wurtzite crystal structure in which the c-axis direction is the vertical direction.

FIGS. 7A and 7B illustrate a corundum crystal structure; black circles represent indium, gallium, titanium, vanadium, chromium, iron, or aluminum, and white circles represent oxygen. FIG. 7A is a schematic diagram of a corundum crystal structure in the a-b plane, and FIG. 7B is a schematic diagram of a corundum crystal structure in which the c-axis direction is the vertical direction.

The second material film is a crystalline oxide semiconductor film including zinc, indium, or gallium. Examples thereof are four-component metal oxides such as an In—Al—Ga—Zn—O-based material and an In—Sn—Ga—Zn—O-based material, three-component metal oxides such as an In—Ga—Zn—O-based material, an In—Al—Zn—O-based material, an In—Sn—Zn—O-based material, and a Sn—Ga—Zn—O-based material, an Al—Ga—Zn—O-based material, and a Sn—Al—Zn—O-based material, two-component metal oxides such as an In—Zn—O-based material, an In—Ga—O-based material, a Sn—Zn—O-based material, and an Al—Zn—O-based material, and the like. In addition, an In—Si—Ga—Zn—O-based material, an In—Ga—B—Zn—O-based material, or an In—B—Zn—O-based material may be used. In addition, the above materials may contain $SiO_2$. For example, an In—Ga—Zn—O-based material means an oxide material containing indium (In), gallium (Ga), and zinc (Zn), and there is no limitation on the composition ratio thereof. In addition, the material may contain an element other than In, Ga, and Zn.

The second material film is formed by a sputtering method, and the substrate temperature in the film formation is set to be higher than or equal to 200° C. and lower than or equal to 400° C. By setting the substrate temperature in the film formation to be higher than or equal to 200° C. and lower than or equal to 400° C., the second material film formed on and in contact with the surface of the first material film can have a hexagonal crystal structure.

During formation of the second material film by a sputtering method, the temperature of the surface where the film is formed is preferably higher than or equal to 250° C. and lower than or equal to the upper limit of the heat treatment temperature for the substrate. The temperature at which entry of impurities such as water or hydrogen into a film to be formed is prevented and the impurity is released to a vapor phase in the chamber is 250° C. In addition, the upper limit of the temperature of the surface where a film is formed by a sputtering method is the upper limit of the heat treatment temperature for the substrate or the upper limit of the temperature of the film to be formed (if the temperature exceeds the latter upper limit, components in the film significantly change). By setting the substrate temperature during film formation to be higher than or equal to 250° C., the second material film formed on and in contact with the surface of the first material film can have a hexagonal crystal structure.

In addition, the pressure of a treatment chamber in a sputtering apparatus for forming the second material film is set to 0.4 Pa or less, whereby entry of impurities such as an alkali metal or hydrogen into an object to be formed or a surface of the object to be formed can be suppressed. Note that hydrogen may be contained in the object as a hydrogen molecule, water, a hydroxyl group, or hydride in some cases in addition to a hydrogen atom.

Further, when the leakage rate of the treatment chamber of the sputtering apparatus is set lower than or equal to $1 \times 10^{-10}$ Pa·m$^3$/sec, entry of impurities such as an alkali metal and hydride into the crystalline oxide semiconductor film that is being formed by a sputtering method can be suppressed.

In order to decrease the leakage rate, internal leakage as well as external leakage needs to be reduced. The external leakage refers to inflow of a gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate be lower than or equal to $1 \times 10^{-10}$ Pa·m$^3$/sec.

In order to reduce external leakage, an open/close portion of the treatment chamber is preferably sealed with a metal gasket. For the metal gasket, a metal material covered with iron fluoride, aluminum oxide, or chromium oxide is preferably used. The metal gasket realizes higher adhesion than an O-ring, and can reduce the external leakage. Further, by use of a metal material covered with iron fluoride, aluminum oxide, chromium oxide, or the like which is in the passive state, released gas containing hydrogen generated from the metal gasket is suppressed, so that the internal leakage can also be reduced.

As a member used for the inner wall of the treatment chamber of the sputtering apparatus, aluminum, chromium, titanium, zirconium, nickel, or vanadium, from which a small amount of a gas containing hydrogen is released, is used. An alloy material containing iron, chromium, nickel, and the like covered with the above-mentioned material may be used. The alloy material containing iron, chromium, nickel, and the like is rigid, resistant to heat, and suitable for processing. Here, when surface unevenness of the member is decreased by polishing or the like to reduce the surface area, the released gas can be reduced. Alternatively, the above-mentioned member of the sputtering apparatus may be covered with iron fluoride, aluminum oxide, chromium oxide, or the like which is in the passive state.

The member provided inside the treatment chamber of the sputtering apparatus is preferably formed with only a metal material as much as possible. For example, in the case where a viewing window formed with quartz or the like is provided, a surface is preferably covered thinly with iron fluoride, aluminum oxide, chromium oxide, or the like which is in the passive state so as to reduce the released gas.

Furthermore, it is preferable to provide a gas refiner for a sputtering gas just in front of the treatment chamber of the sputtering apparatus. At this time, the length of a pipe between the gas refiner and the treatment chamber is less than or equal to 5 m, preferably less than or equal to 1 m. When the length of the pipe is less than or equal to 5 m, or less than or equal to 1 m, the effect of the released gas from the pipe can be reduced accordingly.

A pipe through which a sputtering gas flows from a cylinder to the treatment chamber of the sputtering apparatus is preferably a metal pipe the inside of which is covered with iron fluoride, aluminum oxide, chromium oxide, or the like which is in the passive state. With the above-mentioned pipe, the amount of released gas containing hydrogen is small and entry of impurities into the film formation gas can be reduced as compared with a SUS316L-EP pipe, for example. Further, a high-performance ultra-compact metal gasket joint (a UPG joint) is preferably used as a joint of the pipe. In addition, a structure where all the materials of the pipe are metal materials is preferable, because the effect of the generated released gas or the external leakage can be reduced as compared to a structure where a resin or the like is used.

Evacuation of the treatment chamber of the sputtering apparatus is preferably performed with a rough vacuum pump, such as a dry pump, and a high vacuum pump, such as a sputter ion pump, a turbo molecular pump, or a cryopump, in appropriate combination. The turbo molecular pump has an outstanding capability in evacuating a large-sized molecule, whereas it has a low capability in evacuating hydrogen or water. Hence, combination of a cryopump having a high capability in evacuating water and a sputter ion pump having a high capability in evacuating hydrogen is effective.

Because an adsorbate present inside the treatment chamber of the sputtering apparatus is adsorbed on the inner wall, the adsorbate does not affect the pressure in the treatment chamber, but the adsorbate leads to release of gas at the time of the evacuation of the treatment chamber. Therefore, although the leakage rate and the evacuation rate do not have a correlation, it is important that the adsorbate present in the treatment chamber be desorbed as much as possible and evacuation be performed in advance with use of a pump having high evacuation capability. Note that the treatment chamber may be subjected to baking for promotion of desorption of the adsorbate. By the baking, the rate of desorption of the adsorbate can be increased about tenfold. The baking should be performed at a temperature higher than or equal to 100° C. and lower than or equal to 450° C. At this time, when the adsorbate is removed while an inert gas is introduced, the rate of desorption of water or the like, which is difficult to desorb simply by evacuation, can be further increased.

When the purity of the target is set to 99.99% or higher, an alkali metal, hydrogen atoms, hydrogen molecules, water, a hydroxyl group, hydride, or the like entering the crystalline oxide semiconductor film can be reduced. In addition, when the target is used, the concentration of an alkali metal such as lithium, sodium, or potassium can be reduced in the crystalline oxide semiconductor film.

Under the above film formation conditions, a crystalline oxide semiconductor film is formed. As a result, purification of materials is performed during film formation, and accordingly the crystalline oxide semiconductor film including an extremely small amount of impurities in which the concentration of an alkali metal is lower than or equal to $5 \times 10^{16}$ atoms/cm$^3$ and the concentration of hydrogen is lower than or equal to 1×10$^{19}$ atoms/cm$^3$ can be formed.

The thus obtained stack of the first and second material films is used for a transistor, whereby the transistor can have stable electrical characteristics and high reliability. Further, by setting the maximum heating temperature in the process for transistors to be lower than or equal to 450° C., mass production of highly reliable semiconductor devices can be performed with use of a large-sized substrate such as a mother glass.

In the above method for manufacturing a semiconductor device, an entrapment vacuum pump is preferably used for evacuating the treatment chamber when the first material film and/or the second material film and/or a gate insulating layer are/is manufactured. For example, a cryopump, an ion pump, or a titanium sublimation pump is preferably used. The above entrapment vacuum pump functions so as to reduce the amount of hydrogen, water, a hydroxyl group, or hydride in the first material film and/or the second material film and/or the gate insulating layer.

Since there is a possibility that hydrogen, water, a hydroxyl group, or a hydride becomes one of factors inhibiting crystallization of an oxide semiconductor film, the manufacturing steps of film formation, substrate transfer, and the like are preferably performed in an atmosphere where these impurities are sufficiently reduced.

A semiconductor device obtained by the above manufacturing method is also one embodiment of the invention. The embodiment of the invention is a semiconductor device including a first material film having a hexagonal crystal structure over an insulating surface, a second material film having a hexagonal crystal structure on and in contact with the first material film, a gate insulating layer over the second material film, and a gate electrode layer over the gate insulating layer. The second material film is thicker than the first material film, and the second material film is a crystalline oxide semiconductor film.

Another embodiment of the invention is a semiconductor device including a gate electrode layer over an insulating surface, a gate insulating layer over the gate electrode layer, a first material film having a hexagonal crystal structure over the gate insulating layer, and a second material film having a hexagonal crystal structure on and in contact with the first material film. The second material film is thicker than the first material film, and the second material film is a crystalline oxide semiconductor film.

A transistor, in which a channel region is included in a crystalline oxide semiconductor film having a hexagonal crystal structure where bonds for forming hexagonal lattices are formed in the a-b plane and c-axes are substantially perpendicular to a plan surface of a substrate which is substantially parallel to the a-b plane, is manufactured, whereby the amount of change in the threshold voltage of the transistor between before and after performance of a bias-thermal stress (BT) test or light irradiation of the transistor can be reduced. Thus, the transistor can have stable electrical characteristics.

One reason for high reliability of a transistor including a crystalline oxide semiconductor film will be described below.

A crystalline oxide semiconductor has higher orderliness of a bond between metal and oxygen (-M-O-M-, where O represents an oxygen atom and M represents a metal atom) than an amorphous oxide semiconductor. In other words, in the case where an oxide semiconductor has an amorphous structure, the coordination number may vary depending on the kind of metal. In contrast, in the case of a crystalline oxide semiconductor, the coordination number is substantially uniform. Accordingly, microscopic oxygen vacancies can be reduced, and instability and charge transfer due to attachment or detachment of a hydrogen atom (including a hydrogen ion) or an alkali metal atom in a "space" described later can be reduced.

On the other hand, in the case of an amorphous structure, since the coordination number varies depending on the kind of metal, the concentration of metal atoms or oxygen atoms may be microscopically uneven and there may be some portions where no atom exists ("space"). In such a "space", for example, a hydrogen atom (including a hydrogen ion) or an alkali metal atom is trapped and, in some cases, bonded to oxygen. Further, it is possible for those atoms to move through such a "space".

Movement of such an atom may cause variation in characteristics of an oxide semiconductor, and thus the existence of such an atom leads to a significant problem in reliability. In particular, movement of such an atom is caused by application of a high electric field or light energy; therefore, when an oxide semiconductor is used under such a condition, characteristics thereof are unstable. That is, the reliability of an amorphous oxide semiconductor is inferior to that of a crystalline oxide semiconductor.

Hereinafter, it will be described using a difference in reliability between actually obtained transistors (Sample 1 and Sample 2). Note that Sample 2 that is actually obtained and described below includes a crystalline oxide semiconductor film obtained by forming a first material film at a film formation temperature of 200° C. and then performing heating at 450° C. in a nitrogen atmosphere and by forming a second material film at a film formation temperature of 200° C. and then performing heating at 450° C. in a dry air atmosphere. Sample 2 includes the crystalline oxide semiconductor film including the first and second material films of the same material; it is needless to say that the same applies even when the first and second material films include different materials. Sample 1 that is used for comparison includes a crystalline oxide semiconductor film obtained by heating a single-layer material film by RTA at 650° C. and then performing heating at 450° C. in a dry air atmosphere.

As a method for examining the reliability, an Id–Vg curve of a transistor is measured, which is obtained by measuring the current (Id) between a drain electrode and a source electrode of the transistor when the voltage (Vg) between a gate electrode and the source electrode of the transistor is changed with the transistor irradiated with light. In a transistor including an oxide semiconductor film, when a –BT test is performed, i.e., when a negative gate stress is applied with the transistor irradiated with light, degradation in which the threshold voltage of the transistor is changed is caused. This degradation is also referred to as negative-bias temperature stress photodegradation.

Negative-bias temperature stress photodegradation in Samples 1 and 2 is shown in FIG. 11.

In FIG. 11, the amount of change in Vth in Sample 2 is smaller than that in Sample 1.

FIG. 12A is a graph of photoresponse characteristics (a graph of time dependence of photocurrent) which is made on the basis of results of measuring photoresponse characteristics of the transistor of Sample 1 (L/W=3 μm/50 μm) before and after it is irradiated with light (wavelength: 400 nm, irradiation intensity: 3.5 mW/cm$^2$) for 600 seconds. Note that the source-drain voltage (Vd) is 0.1 V.

FIG. 12B is a graph of photoresponse characteristics (a graph of time dependence of photocurrent) which is made on the basis of results of measuring photoresponse characteristics of the transistor of Sample 2 (L/W=3 μm/50 μm) before and after it is irradiated with light (wavelength: 400 nm, irradiation intensity: 3.5 mW/cm$^2$) for 600 seconds. Note that the source-drain voltage (Vd) is 0.1 V.

Further, measurement was performed on a transistor which was formed under the same manufacturing conditions as Sample 2 and had a larger W width (L/W=30 μm/10000 μm) and a transistor which was formed under the same manufacturing conditions as Sample 2, had the larger W width, and was supplied with higher Vd (Vd=15 V), and fitting was performed on the measurement results. Two kinds of relaxation time (τ1 and τ2) are shown in Table 1.

TABLE 1

|  | Imax [A] | τ$_1$ [sec] | τ$_2$ [sec] |
|---|---|---|---|
| Sample 1: L/W = 3/50, Vd = 0.1 V | 4.60E−11 | 2.6 | 90 |
| Sample 2: L/W = 3/50, Vd = 0.1 V | 9.20E−12 | 0.4 | 43 |
| L/W = 30/100000 μm, Vd = 0.1 V | 6.20E−11 | 0.3 | 39 |
| L/W = 30/100000 μm, Vd = 15 V | 9.20E−10 | 0.4 | 75 |

Note that the two kinds of relaxation time (τ1 and τ2) depend on the trap density. A method for calculating τ1 and τ2 is referred to as a photoresponse defect evaluation method.

It is found from Table 1 that the transistor of the Sample 2 and the transistors formed under the manufacturing conditions of Sample 2, in which negative-bias temperature stress photodegradation is small, each have higher photoresponse characteristics than Sample 1. Accordingly, a relation that higher photoresponse characteristics are obtained as negative-bias temperature stress photodegradation is smaller can be found.

One reason for that will be described. If there exists a deep donor level and a hole is trapped by the donor level, the hole might become fixed charge by a negative bias applied to a gate in negative-bias temperature stress photodegradation and the relaxation time of a current value might be increased in photoresponse. A reason why a transistor including a crystalline oxide semiconductor film has small negative-bias temperature stress photodegradation and high photoresponse characteristics is thought to be attributed to low density of the above donor level that traps a hole. FIG. 13 is a schematic diagram of an assumed donor level.

In order to examine changes in the depth and density of the donor level, measurement using low-temperature PL was performed. FIG. 14 shows measurement results in the case where the substrate temperature in formation of an oxide semiconductor film is 400° C. and in the case where the substrate temperature in formation of an oxide semiconductor film is 200° C.

According to FIG. 14, when the substrate temperature in formation of the oxide semiconductor film is 400° C., the peak intensity in the vicinity of about 1.8 eV was much lower than that in the case where the substrate temperature is 200° C. The measurement results indicate that the density of the donor level is significantly reduced while the depth thereof is not changed.

Oxide semiconductor films were formed under varied conditions of the substrate temperature, were compared to each other, and were each evaluated as a single film.

Sample A has a structure in which a 50-nm-thick oxide semiconductor film is formed over a quartz substrate (thickness: 0.5 mm). Note that the oxide semiconductor film is formed under the following conditions: a target for an oxide semiconductor (a target for an In—Ga—Zn—O-based oxide semiconductor ($In_2O_3$:$Ga_2O_3$:ZnO=1:1:2 [molar ratio])) is used; the distance between the substrate and the target is 170 mm; the substrate temperature is 200° C.; the pressure is 0.4 Pa; the direct current (DC) power is 0.5 kW; and the atmosphere is a mixed atmosphere of argon (30 sccm) and oxygen (15 sccm).

The electron spin resonance (ESR) spectroscopy of samples was measured at room temperature (300 K). With the use of a value of a magnetic field (H0) where a microwave (frequency: 9.5 GHz) is absorbed for an equation g=hv/βH$_0$, a parameter of a g-factor is obtained. Note that h and β represent the Planck constant and the Bohr magneton, respectively, and are both constants.

FIG. 15A is a graph showing the g-factor of Sample A.

Sample B is formed in such a manner that deposition is performed under the same conditions as Sample A and then heating is performed at 450° C. for 1 hour in a nitrogen atmosphere. FIG. 15B is a graph showing the g-factor of Sample B.

Sample C is formed in such a manner that deposition is performed under the same conditions as Sample A and then heating is performed at 450° C. for 1 hour in a mixed atmosphere of nitrogen and oxygen. FIG. 15C is a graph showing the g-factor of Sample C.

In the graph of the g-factor of Sample B, a signal of g=1.93 were observed and the spin density was 1.8×10$^{18}$ [spins/cm$^3$]. On the other hand, the signal of g=1.93 was not observed in the result of ESR measurement of Sample C, and thus the signal of g=1.93 was attributed to a dangling bond of metal in the oxide semiconductor film.

In addition, Samples D, E, F, and G each have a structure in which a 100-nm-thick oxide semiconductor film is formed over a quartz substrate (thickness: 0.5 mm). Note that the oxide semiconductor film is formed under the following conditions: a target for an oxide semiconductor (a target for an In—Ga—Zn—O-based oxide semiconductor ($In_2O_3$:$Ga_2O_3$:ZnO=1:1:2 [molar ratio])) is used; the distance between the substrate and the target is 170 mm; the pressure is 0.4 Pa; the direct current (DC) power is 0.5 kW; and the atmosphere is a mixed atmosphere of argon (30 sccm) and oxygen (15 sccm). Samples D, E, F, and G are formed at different substrate temperatures: room temperature for Sample D, 200° C. for Sample E, 300° C. for Sample F, and 400° C. for Sample G.

Graphs of the g-factor of Samples D, E, F, and G are shown in this order in FIG. 16.

In Sample G whose substrate temperature in deposition is 400° C., the signal of g=1.93 was observed and the spin density was 1.3×10$^{18}$ [spins/cm$^3$]. The spin density is the same level as the spin density of the signal of g=1.93 obtained in Sample B.

From these results, it is confirmed that the anisotropy of the g-factor is increased when the substrate temperature in deposition is increased, which can be thought to be attributed to improvement in crystallinity. The results also indicate that a dangling bond that causes the signal g=1.93 depends on the film thickness and exists in a bulk of IGZO.

FIG. 17 is a graph of ESR measurement of Sample B and shows a difference (anisotropy) in the g-factor between the case where a magnetic field is applied perpendicularly to a substrate surface and the case where a magnetic field is applied in parallel to the substrate surface.

FIG. 18 is a graph of ESR measurement of Sample H which is formed in such a manner that deposition is performed under the same conditions as Sample G and then heating is performed at 450° C. for 1 hour in a nitrogen atmosphere, and shows a difference (anisotropy) in the g-factor between the case where a magnetic field is applied perpendicularly to a substrate surface and the case where a magnetic field is applied in parallel to the substrate surface.

As a result of comparison between FIG. 17 and FIG. 18, it is found that the change Δg in the g-factor due to anisotropy is 0.001 or lower at a substrate temperature of 200° C. whereas the change Δg is increased to 0.003 at a substrate temperature of 400° C. It is generally known that the anisotropy is increased as the crystallinity becomes higher (directions of orbits are more aligned). Thus, a conclusion is led that in a film formed at a substrate temperature of 400° C., the directions of dangling bonds of metal generated by heating at 450° C. for 1 hour in a nitrogen atmosphere are well aligned as compared to those in a film formed at a substrate temperature of 200° C.; that is, the former has higher crystallinity than the latter.

Further, ESR measurement was performed under varied conditions of the thickness of an oxide semiconductor film. Change in the intensity of the signal g=1.93 is shown in FIG. 19 and FIG. 20. From the results in FIG. 19 and FIG. 20, it is confirmed that the intensity of the signal g=1.93 is increased as the thickness of the oxide semiconductor film is increased. This indicates that a dangling bond that causes the signal g=1.93 exists not at an interface between the quartz substrate and the oxide semiconductor film or a surface of the oxide semiconductor film but in a bulk of the oxide semiconductor film.

It is found from these results that a dangling bond of metal has anisotropy and that the anisotropy is increased as the deposition temperature gets higher because higher crystallinity is obtained at higher deposition temperature. In addition, it is found that the dangling bond of metal exists not at the interface or surface but in the bulk.

In the case where the temperature of a process for forming a first material film having a hexagonal crystal structure is 450° C. or lower, a crystalline oxide semiconductor film can be formed thereover at 450° C. or lower. Thus, mass production of highly reliable semiconductor devices can be performed with use of a large-sized substrate such as a mother glass.

DETAILED DESCRIPTION OF THE INVENTION

Embodiments of the present invention will be described in detail below with reference to drawings. Note that the present invention is not limited to the description below, and it is easily understood by those skilled in the art that modes and details disclosed herein can be modified in various ways. In addition, the present invention should not be construed as being limited to the description in the embodiments given below.

(Embodiment 1)

In this embodiment, a structure of a semiconductor device and a manufacturing method thereof will be described with reference to FIGS. 1A to 1E.

Figure 1A:
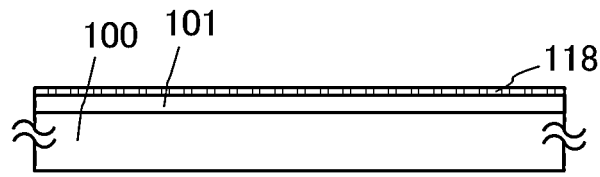
FIGS. 1A to 1E are cross-sectional views of one embodiment of the present invention.
Figure 1B:
Figure 1C:
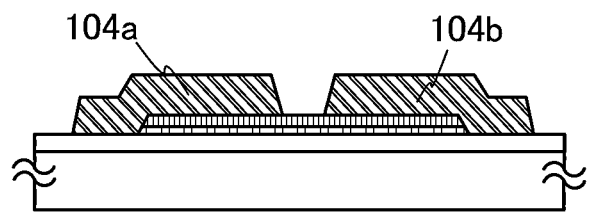
Figure 1D:
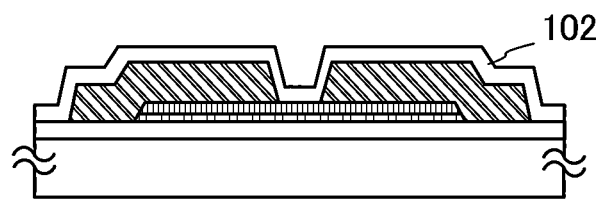
Figure 1E:
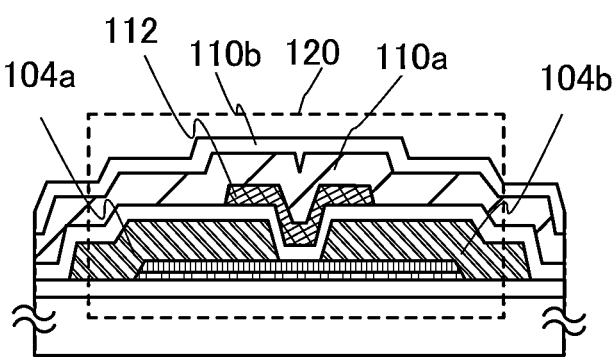

FIG. 1E is a cross-sectional view of a top-gate transistor 120. The transistor 120 includes, over a substrate 100 having an insulating surface, an oxide insulating layer 101, a stack of semiconductor layers including a channel formation region, a source electrode layer 104a, a drain electrode layer 104b, a gate insulating layer 102, a gate electrode layer 112, and an insulating film 110a. The source electrode layer 104a and the drain electrode layer 104b are provided to cover end portions of the stack of semiconductor layers, and the gate insulating layer 102 covering the source electrode layer 104a and the drain electrode layer 104b is in contact with part of the stack of semiconductor layers. The gate electrode layer 112 is provided over the part of the stack of semiconductor layers with the gate insulating layer 102 interposed therebetween.

In addition, an insulating film 110b is provided to cover the insulating film 110a.

A process for manufacturing the transistor 120 over the substrate is described below with reference to FIGS. 1A to 1E.

First, the oxide insulating layer 101 is formed over the substrate 100.

As the substrate 100, a non-alkali glass substrate formed by a fusion method or a float method, a plastic substrate having heat resistance sufficient to withstand a process temperature of this manufacturing process, or the like can be used. In addition, a substrate where an insulating film is provided on a surface of a metal substrate such as a stainless steel substrate, or a substrate where an insulating film is provided on a surface of a semiconductor substrate may be used. In the case where the substrate 100 is mother glass, the substrate may have any of the following sizes: the first generation (320 mm×400 mm), the second generation (400 mm×500 mm), the third generation (550 mm×650 mm), the fourth generation (680 mm×880 mm or 730 mm×920 mm), the fifth generation (1000 mm×1200 mm or 1100 mm×1250 mm), the sixth generation (1500 mm×1800 mm), the seventh generation (1900 mm×2200 mm), the eighth generation (2160 mm×2460 mm), the ninth generation (2400 mm×2800 mm or 2450 mm×3050 mm), the tenth generation (2950 mm×3400 mm), and the like. The mother glass drastically shrinks when the treatment temperature is high and the treatment time is long. Thus, in the case where mass production is performed with use of the mother glass, the preferable heating temperature in the manufacturing process is lower than or equal to 600° C., further preferably, lower than or equal to 450° C.

The oxide insulating layer 101 is formed by a PCVD method or a sputtering method to have a thickness greater than or equal to 50 nm and less than or equal to 600 nm, using one of a silicon oxide film, a gallium oxide film, an aluminum oxide film, a silicon oxynitride film, an aluminum oxynitride film, and a silicon nitride oxide film or a stacked layer including any of the above films. The oxide insulating layer 101 used as a base insulating layer preferably contains a large amount of oxygen which exceeds at least the stoichiometry in (a bulk of) the layer. For example, in the case where a silicon oxide film is used, the composition formula is $SiO_{2+\alpha}$ ($\alpha>0$). When the oxide insulating layer 101 has a large thickness, the amount of oxygen released from the oxide insulating layer 101 in heat treatment to be performed later can be increased, and the increase makes it possible to reduce defects at the interface between the oxide insulating layer 101 and an oxide semiconductor film to be formed later.

In the case where a glass substrate including an impurity such as an alkali metal is used, a silicon nitride film, an aluminum nitride film, or the like may be formed as a nitride insulating layer between the oxide insulating layer 101 and the substrate 100, by a PCVD method or a sputtering method in order to prevent entry of an alkali metal. Since an alkali metal such as Li or Na is an impurity, it is preferable to reduce the content of such an alkali metal.

Next, a first material film 118 having a thickness of 1 nm to 10 nm is formed over the oxide insulating layer 101 (see FIG. 1A).

In this embodiment, as the first material film 118, a gallium nitride film having a hexagonal crystal structure is obtained by a molecular beam epitaxy (MBE) method using gallium and plasma-activated nitrogen. Not only an MBE method but also another method can be used as long as a gallium nitride film having a hexagonal crystal structure can be obtained; a gallium nitride film having a hexagonal crystal structure can be formed by a metal organic chemical vapor deposition (MOCVD) method using trimethyl gallium and an ammonium gas as a source gas and using a nitrogen gas or the like as a carrier gas. The first material film 118 has bonds for forming hexagonal lattices in the a-b plane and includes a gallium nitride crystal having a hexagonal crystal structure in which the c-axis is substantially perpendicular to a plan surface of the substrate which is substantially parallel to the a-b plane. The first material film 118 serves as a seed crystal. Note that the seed crystal includes, in the c-axis direction, at least one atomic layer having bonds for forming hexagonal lattices in the a-b plane.

Next, using the first material film 118 as a seed crystal, a second material film, i.e., a crystalline oxide semiconductor film 108 including a crystal having a hexagonal crystal structure, is formed thereover without being exposed to the air (see FIG. 1B). The second material film is thicker than the first material film and is, for example, thicker than 10 nm.

In this embodiment, as the second material film, the crystalline oxide semiconductor film 108 having a thickness of 25 nm is formed in an oxygen atmosphere, an argon atmosphere, or an atmosphere including argon and oxygen under conditions where a target for an oxide semiconductor (a target for an In—Ga—Zn—O-based oxide semiconductor ($In_2O_3$: $Ga_2O_3$:ZnO=1:1:2 [molar ratio])) is used, the distance between the substrate and the target is 170 mm, the substrate temperature is 400° C., the pressure is 0.4 Pa, and the direct-current (DC) power is 0.5 kW.

In formation of the second material film, a rare gas (typically, argon), oxygen, or a mixed gas of a rare gas and oxygen is used as a sputtering gas as appropriate. It is preferable that a high-purity gas from which impurities such as hydrogen, water, a hydroxyl group, and hydride are removed be used as a sputtering gas. Note that the pressure of a treatment chamber for forming the second material film is set to 0.4 Pa or less, whereby entry of impurities such as an alkali metal or hydrogen into the surface or inside of the crystalline oxide semiconductor film can be suppressed. Further, when the leakage rate of the treatment chamber for forming the second material film is set lower than or equal to $1\times10^{-10}$ Pa·m³/sec, entry of impurities such as an alkali metal, hydrogen, water, a hydroxyl group, or hydride into the crystalline oxide semiconductor film that is being formed by a sputtering method can be suppressed. Further, with the use of an entrapment vacuum pump as an exhaustion system, counter flow of impurities such as an alkali metal, hydrogen, water, a hydroxyl group, or hydride from the exhaustion system can be reduced. When the purity of the target used for forming the second material film is set to 99.99% or higher, an alkali metal, hydrogen, water, a hydroxyl group, hydride, or the like entering the crystalline oxide semiconductor film can be reduced. With the use of the target, in the crystalline oxide semiconductor film, the concentration of lithium can be $5\times10^{15}$ cm$^{-3}$ or less, preferably $1\times10^{15}$ cm$^{-3}$ or less; the concentration of sodium can be $5\times10^{16}$ cm$^{-3}$ or less, preferably $1\times10^{16}$ cm$^{-3}$ or less, more preferably $1\times10^{15}$ cm$^{-3}$ or less; and the concentration of potassium can be $5\times10^{15}$ cm$^{-3}$ or less, preferably $1\times10^{15}$ cm$^{-3}$ or less.

An alkali metal and an alkaline earth metal are unfavorable impurities for the crystalline oxide semiconductor film and are preferably contained as little as possible. In particular, among alkali metals, sodium is diffused to the oxide insulating film in contact with the crystalline oxide semiconductor and becomes Na$^+$. In addition, sodium cuts a bond between metal and oxygen or enters the bond in the crystalline oxide semiconductor. As a result, transistor characteristics deteriorate (e.g., the transistor becomes normally-on (the shift of a threshold voltage to a negative side) or the mobility is decreased). In addition, this also causes variation in the characteristics. Such a problem is significant especially in the case where the concentration of hydrogen in the crystalline oxide semiconductor film is extremely low. Therefore, it is highly preferable to set the concentration of an alkali metal in the above range in the case where the concentration of hydrogen contained in the crystalline oxide semiconductor film is lower than or equal to $5\times10^{19}$ cm$^{-3}$, particularly lower than or equal to $5\times10^{18}$ cm$^{-3}$.

In the formation of the second material film, the substrate is heated with a heater provided in a substrate supporting member to a temperature higher than or equal to 250° C. and lower than or equal to the upper limit of the heat treatment temperature for the substrate. Accordingly, in the film formation, with use of a seed crystal as a nucleus, crystal growth proceeds while atoms deposited on a film formation surface are being oxidized; thus, the crystalline oxide semiconductor film 108 can be manufactured.

The crystalline oxide semiconductor film is formed under the above conditions, whereby the amount of impurities in the crystalline oxide semiconductor film can be extremely small (the concentration of an alkali metal is lower than or equal to $5\times10^{16}$ atoms/cm³, and the concentration of hydrogen is lower than or equal to $1\times10^{19}$ atoms/cm³). By reduction of the impurities in the crystalline oxide semiconductor film, crystal growth of the seed crystal and the crystalline oxide semiconductor film is promoted, and a single crystal oxide semiconductor film or a substantially single crystal oxide semiconductor film can be formed. The crystalline oxide semiconductor film 108 described in this embodiment does not have an amorphous structure but a crystalline structure, ideally, a single crystal structure, and comprises an oxide including a crystal in which the c-axis is substantially perpendicular to a plan surface of the substrate (such a crystal is also referred to as C-Axis Aligned Crystal (CAAC)).

Next, heat treatment is performed under a condition where the atmosphere of a chamber in which the substrate is set is an atmosphere of nitrogen or dry air. The temperature of the heat treatment is higher than or equal to 400° C. and lower than or equal to 750° C. In addition, heating time of the heat treatment is longer than or equal to 1 minute and shorter than or equal to 24 hours.

Figure 8:
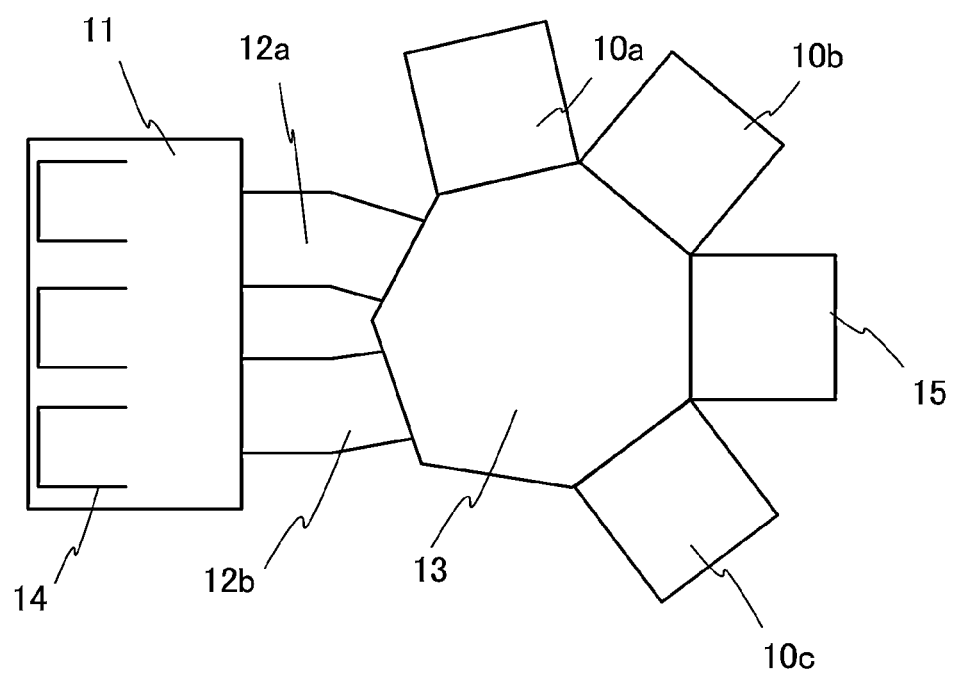
FIG. 8 is a top view illustrating an example of a manufacturing apparatus used to manufacture one embodiment of the present invention.

It is preferable that the steps from the formation of the oxide insulating layer 101 to the heat treatment be performed successively without exposure to air. For example, a manufacturing apparatus whose top view is illustrated in FIG. 8 may be used. The manufacturing apparatus illustrated in FIG. 8 is a single wafer multi-chamber apparatus, which includes three film formation devices 10a, 10b, and 10c, a substrate supply chamber 11 provided with three cassette ports 14 for holding process substrates, load lock chambers 12a and 12b, a transfer chamber 13, a substrate heating chamber 15, and the like. Note that a transfer robot for transferring process substrates is provided in each of the substrate supply chamber 11 and the transfer chamber 13. The atmospheres of the film formation devices 10a, 10b, and 10c, the transfer chamber 13, and the substrate heating chamber 15 are preferably controlled so as to hardly contain hydrogen and moisture (i.e., to an inert atmosphere, a reduced pressure atmosphere, or a dry air atmosphere). For example, a preferable atmosphere is a dry nitrogen atmosphere in which the dew point of moisture is −40° C. or lower, preferably −50° C. or lower. An example of a procedure of the manufacturing steps with use of the manufacturing apparatus illustrated in FIG. 8 is as follows. A process substrate is transferred from the substrate supply chamber 11 to the substrate heating chamber 15 through the load lock chamber 12a and the transfer chamber 13; moisture attached to the process substrate is removed by vacuum baking in the substrate heating chamber 15; the process substrate is transferred to the film formation device 10c through the transfer chamber 13; and the oxide insulating layer 101 is formed in the film formation device 10c. Then, the process substrate is transferred to the film formation device 10a through the transfer chamber 13 without exposure to air, and the first material film 118 having a thickness of 5 nm is formed in the film formation device 10a. Then, the process substrate is transferred to the film formation device 10b through the transfer chamber 13, and the crystalline oxide semiconductor film 108 which is thicker than 10 nm is formed in the film formation device 10b. Then, the process substrate is transferred to the substrate heating chamber 15 through the transfer chamber 13 without exposure to air and the heat treatment is performed. As described above, with use of the manufacturing apparatus illustrated in FIG. 8, a manufacturing process can proceed without exposure to air.

Next, the stack of semiconductor layers including the first material film 118 and the crystalline oxide semiconductor film 108 is processed into an island-shaped stack of semiconductor layers. In the drawings, the interface between the first material film 118 and the crystalline oxide semiconductor film 108 is indicated by a solid line and these films are described as a stack of layers because they include different materials. In some cases, the interface may become indistinct due to heat treatment or the like in a later step. In the case where the first material film is formed using $\alpha\text{-}Ga_2O_3$ or $In_2O_3$, the interface may be indistinct because it partly includes the same material as the crystalline oxide semiconductor film 108.

The stack of semiconductor layers can be processed by being etched after a mask having a desired shape is formed over the stack of semiconductor layers. The mask may be formed by a method such as photolithography or an ink jet method.

Note that for the etching of the stack of semiconductor layers, either dry etching or wet etching may be employed. It is needless to say that both of them may be employed in combination.

Next, a conductive film used for forming a source electrode layer and a drain electrode layer (including a wiring formed using the same layer as the source electrode layer and the drain electrode layer) is formed over the stack of semiconductor layers and processed into the source electrode layer 104a and the drain electrode layer 104b (see FIG. 1C). The source electrode layer 104a and the drain electrode layer 104b can be formed by a sputtering method or the like so as to have a single-layer structure or a stacked-layer structure using any of metal materials such as molybdenum, titanium, tantalum, tungsten, aluminum, copper, neodymium, and scandium or an alloy material containing any of the above metal materials.

Next, the gate insulating layer 102 is formed to be in contact with part of the stack of semiconductor layers and cover the source electrode layer 104a and the drain electrode layer 104b (see FIG. 1D). The gate insulating layer 102 is an oxide insulating layer, which is formed by a plasma CVD method, a sputtering method, or the like to have a single-layer structure or a stacked-layer structure using any of silicon oxide, silicon oxynitride, silicon nitride oxide, aluminum oxide, gallium oxide, aluminum oxynitride, aluminum nitride oxide, and hafnium oxide, and a combination thereof. The thickness of the gate insulating layer 102 is greater than or equal to 10 nm and less than or equal to 200 nm.

In this embodiment, as the gate insulating layer 102, a silicon oxide film having a thickness of 100 nm is formed by a sputtering method. After formation of the gate insulating layer 102, second heat treatment is performed. The second heat treatment is performed in an inert atmosphere, an oxygen atmosphere, or a mixed atmosphere of oxygen and nitrogen at a temperature higher than or equal to 200° C. and lower than or equal to 400° C. In addition, heating time of the second heat treatment is longer than or equal to 1 minute and shorter than or equal to 24 hours. By the second heat treatment, oxygen is supplied from the gate insulating layer 102 to the stack of semiconductor layers. The higher the temperature of heating treatment is, the more suppressed is the amount of change in the threshold voltage at the time of a −BT test performed with light irradiation.

Next, a conductive film is formed over the gate insulating layer 102 and subjected to a photolithography step, so that the gate electrode layer 112 is formed. The gate electrode layer 112 overlaps with part of the stack of semiconductor layers with the gate insulating layer 102 interposed therebetween. The conductive film for forming the gate electrode layer 112 can be formed by a sputtering method or the like to have a single-layer structure or a stacked-layer structure using any of metal materials such as molybdenum, titanium, tantalum, tungsten, aluminum, copper, neodymium, and scandium or an alloy material which contains any of these materials as a main component.

Next, the insulating film 110a and the insulating film 110b are formed to cover the gate electrode layer 112 and the gate insulating layer 102 (see FIG. 1E).

The insulating film 110a and the insulating film 110b can be formed to have a single-layer structure or a stacked-layer structure using silicon oxide, silicon nitride, gallium oxide, silicon oxynitride, silicon nitride oxide, aluminum oxide, aluminum nitride, aluminum oxynitride, aluminum nitride oxide, hafnium oxide, or a mixed material of these materials. In this embodiment, as the insulating film 110a, a silicon oxide film having a thickness of 300 nm is formed by a sputtering method, and heat treatment is performed for an hour at 250° C. in a nitrogen atmosphere. Then, in order to prevent entry of moisture or an alkali metal, as the insulating film 110b, a silicon nitride film is formed by a sputtering method. Since an alkali metal such as Li or Na is an impurity, the content of the alkali metal is preferably reduced. The concentration of the alkali metal in the stack of semiconductor layers is lower than or equal to $2 \times 10^{16}$ cm$^{-3}$, preferably, lower than or equal to $1 \times 10^{15}$ cm$^{-3}$. Although a two-layer structure of the insulating film 110a and the insulating film 110b is described as an example in this embodiment, a single-layer structure may be used.

Through the above process, the top-gate transistor 120 is formed. The transistor 120 has a channel region in the crystalline oxide semiconductor film including a crystal having a hexagonal crystal structure in which bonds for forming hexagonal lattices are formed in the a-b plane and the c-axes are substantially perpendicular to a plan surface of the substrate which is substantially parallel to the a-b plane. The transistor 120 has a small amount of change in the threshold voltage between before and after light irradiation or the BT test and thus can have stable electrical characteristics.

(Embodiment 2)

In this embodiment, an example of a process which is partially different from that described in Embodiment 1 will be described with reference to FIGS. 2A to 2D. Note that in FIGS. 2A to 2D, the same reference numerals are used for the same parts as those in FIGS. 1A to 1E, and description of the parts with the same reference numerals is omitted here.

Figure 2A:
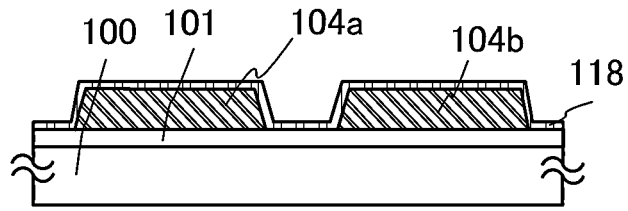
FIGS. 2A to 2D are cross-sectional views of one embodiment of the present invention.
Figure 2B:
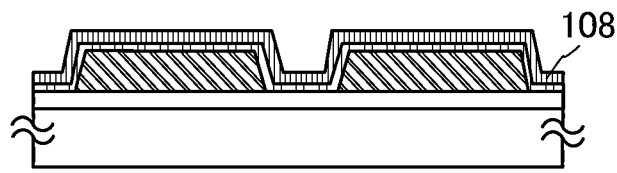
Figure 2C:
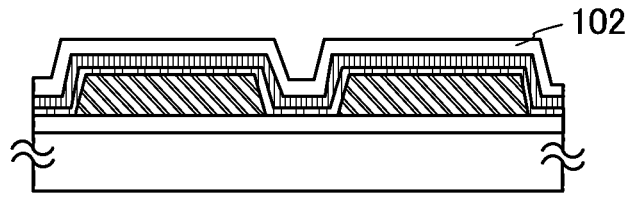
Figure 2D:
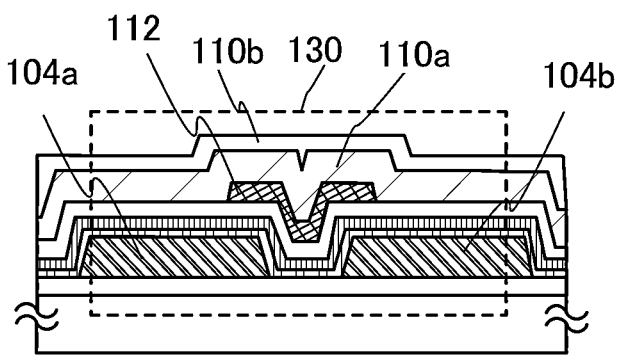

FIG. 2D is a cross-sectional view of a top-gate transistor 130. The transistor 130 includes, over the substrate 100 having an insulating surface, the oxide insulating layer 101, the source electrode layer 104a, the drain electrode layer 104b, the stack of semiconductor layers including a channel formation region, the gate insulating layer 102, the gate electrode layer 112, and the insulating film 110a. The stack of semiconductor layers is provided to cover the source electrode layer 104a and the drain electrode layer 104b. The gate electrode layer 112 is provided over part of the stack of semiconductor layers with the gate insulating layer 102 interposed therebetween.

In addition, the insulating film 110b is provided to cover the insulating film 110a.

A process for manufacturing the transistor 130 over the substrate is described below with reference to FIGS. 2A to 2D.

First, the oxide insulating layer 101 is formed over the substrate 100.

Next, a conductive film used for forming the source electrode layer and the drain electrode layer (including a wiring formed using the same layer as the source electrode layer and the drain electrode layer) is formed over the oxide insulating layer 101 and processed into the source electrode layer 104a and the drain electrode layer 104b.

Next, the first material film 118 having a thickness of 1 nm to 10 nm is formed over the source electrode layer 104a and the drain electrode layer 104b (see FIG. 2A).

Next, the crystalline oxide semiconductor film 108 which is thicker than 10 nm is formed over the first material film 118 (see FIG. 2B).

Then, heat treatment is performed under a condition where the atmosphere of a chamber in which the substrate is set is an atmosphere of nitrogen or dry air. The temperature of the heat treatment is higher than or equal to 400° C. and lower than or equal to 750° C.

Next, if necessary, the stack of semiconductor layers including the first material film 118 and the crystalline oxide semiconductor film 108 is processed into an island-shaped stack of semiconductor layers.

Next, the gate insulating layer 102 is formed over the stack of semiconductor layers (see FIG. 2C).

Next, a conductive film is formed over the gate insulating layer 102 and subjected to a photolithography step, so that the gate electrode layer 112 is formed. The gate electrode layer 112 overlaps with part of the stack of semiconductor layers with the gate insulating layer 102 interposed therebetween.

Then, the insulating film 110a and the insulating film 110b are formed to cover the gate electrode layer 112 and the gate insulating layer 102 (see FIG. 2D).

Through the above process, the top-gate transistor 130 is formed.

The transistor 130 illustrated in FIG. 2D also has a channel region in the crystalline oxide semiconductor film including a crystal having a hexagonal crystal structure in which bonds for forming hexagonal lattices are formed in the a-b plane and the c-axes are substantially perpendicular to a plan surface of the substrate which is substantially parallel to the a-b plane. The transistor 130 has a small amount of change in the threshold voltage between before and after light irradiation or the BT test and thus can have stable electrical characteristics.

This embodiment can be freely combined with Embodiment 1.

(Embodiment 3)

In this embodiment, an example of a process which is partially different from that described in Embodiment 1 will be described with reference to FIGS. 3A to 3F. Note that in FIGS. 3A to 3F, the same reference numerals are used for the same parts as those in FIGS. 1A to 1E, and description of the parts with the same reference numerals is omitted here.

Figure 3A:
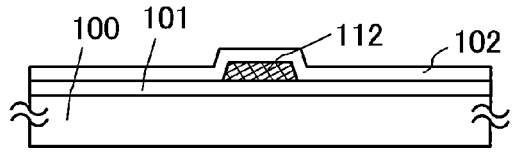
FIGS. 3A to 3F are cross-sectional views of one embodiment of the present invention.
Figure 3B:
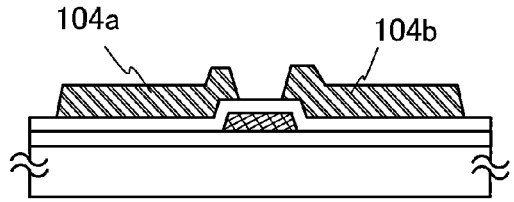
Figure 3C:
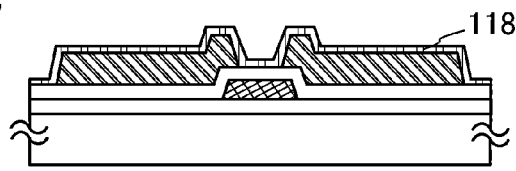
Figure 3D:
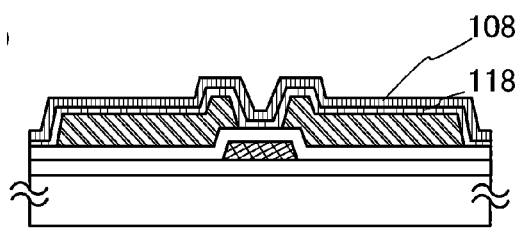
Figure 3E:
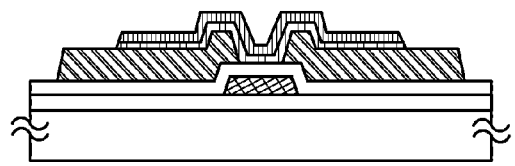
Figure 3F:
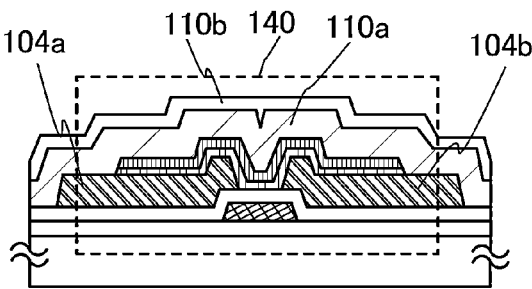

FIG. 3F is a cross-sectional view of a bottom-gate transistor 140. The transistor 140 includes, over the substrate 100 having an insulating surface, the oxide insulating layer 101, the gate electrode layer 112, the gate insulating layer 102, the source electrode layer 104a, the drain electrode layer 104b, the stack of semiconductor layers including a channel formation region, and the insulating film 110a. The stack of semiconductor layers is provided to cover the source electrode layer 104a and the drain electrode layer 104b. A region functioning as a channel formation region is part of the stack of semiconductor layers overlapping with the gate electrode layer 112 with the gate insulating layer 102 interposed therebetween.

In addition, the insulating film 110b is provided to cover the insulating film 110a.

A process for manufacturing the transistor 140 over the substrate is described below with reference to FIGS. 3A to 3F.

First, the oxide insulating layer 101 is formed over the substrate 100.

Next, a conductive film is formed over the oxide insulating layer 101 and subjected to a photolithography step, so that the gate electrode layer 112 is formed.

Next, the gate insulating layer 102 is formed over the gate electrode layer 112 (see FIG. 3A).

Next, a conductive film for forming the source electrode layer and the drain electrode layer (including a wiring formed using the same layer as the source electrode layer and the drain electrode layer) is formed over the gate insulating layer 102 and processed into the source electrode layer 104a and the drain electrode layer 104b (see FIG. 3B).

Next, the first material film 118 having a thickness of 1 nm to 10 nm is formed over the source electrode layer 104a and the drain electrode layer 104b (see FIG. 3C).

Next, the crystalline oxide semiconductor film 108 which is thicker than 10 nm is formed over the first material film 118 (see FIG. 3D).

Then, heat treatment is performed under a condition where the atmosphere of a chamber in which the substrate is set is an atmosphere of nitrogen or dry air. The temperature of the heat treatment is higher than or equal to 400° C. and lower than or equal to 750° C. In addition, heating time of the heat treatment is longer than or equal to 1 minute and shorter than or equal to 24 hours.

Next, the stack of semiconductor layers including the first material film 118 and the crystalline oxide semiconductor film 108 is processed into an island-shaped stack of semiconductor layers (see FIG. 3E).

The stack of semiconductor layers can be processed by being etched after a mask having a desired shape is formed over the stack of semiconductor layers. The mask may be formed by a method such as photolithography or an ink jet method.

Note that for the etching of the stack of semiconductor layers, either dry etching or wet etching may be employed. It is needless to say that both of them may be employed in combination.

Next, the insulating film 110a and the insulating film 110b are formed to cover the stack of semiconductor layers, the source electrode layer 104a, and the drain electrode layer 104b (see FIG. 3F).

Through the above process, the bottom-gate transistor 140 is formed.

The transistor 140 illustrated in FIG. 3F also has a channel region in the crystalline oxide semiconductor film including a crystal having a hexagonal crystal structure in which bonds for forming hexagonal lattices are formed in the a-b plane and the c-axes are substantially perpendicular to a plan surface of the substrate which is substantially parallel to the a-b plane. The transistor 140 has a small amount of change in the threshold voltage between before and after light irradiation or the BT test and thus can have stable electrical characteristics.

This embodiment can be freely combined with Embodiment 1.

(Embodiment 4)

In this embodiment, an example of a process which is partially different from that described in Embodiment 3 will be described with reference to FIGS. 4A to 4E. Note that in FIGS. 4A to 4E, the same reference numerals are used for the same parts as those in FIGS. 3A to 3F, and description of the parts with the same reference numerals is omitted here.

Figure 4A:
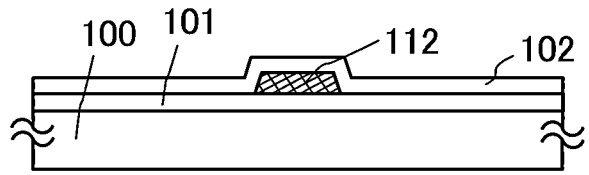
FIGS. 4A to 4E are cross-sectional views of one embodiment of the present invention.
Figure 4B:
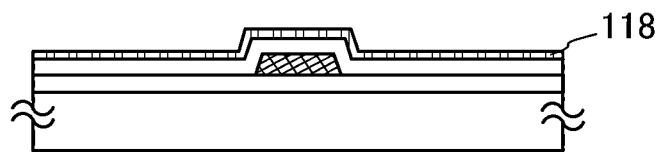
Figure 4C:
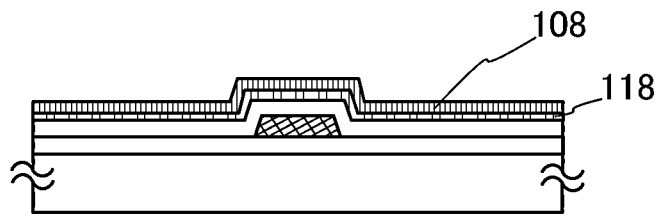
Figure 4D:
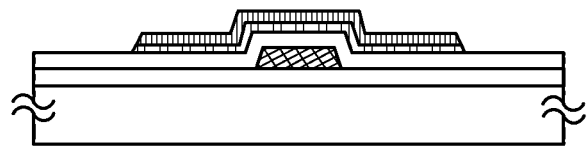
Figure 4E:
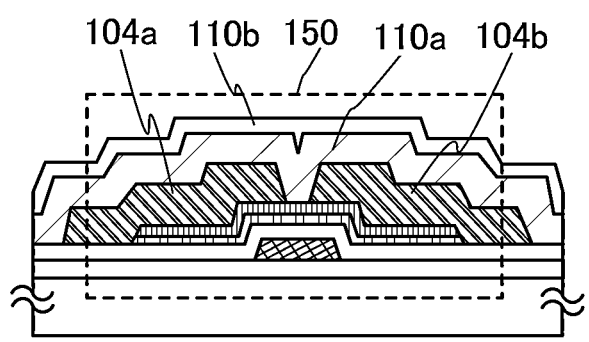

FIG. 4E is a cross-sectional view of a bottom-gate transistor 150. The transistor 150 includes, over the substrate 100 having an insulating surface, the oxide insulating layer 101, the gate electrode layer 112, the gate insulating layer 102, the stack of semiconductor layers including a channel formation region, the source electrode layer 104a, the drain electrode layer 104b, and the insulating film 110a. The source electrode layer 104a and the drain electrode layer 104b are provided to cover the stack of semiconductor layers. A region functioning as a channel formation region is part of the stack of semiconductor layers overlapping with the gate electrode layer 112 with the gate insulating layer 102 interposed therebetween.

In addition, the insulating film 110b is provided to cover the insulating film 110a.

A process for manufacturing the transistor 150 over the substrate is described below with reference to FIGS. 4A to 4E.

First, the oxide insulating layer 101 is formed over the substrate 100.

Next, a conductive film is formed over the oxide insulating layer 101 and subjected to a photolithography step, so that the gate electrode layer 112 is formed.

Next, the gate insulating layer 102 is formed over the gate electrode layer 112 (see FIG. 4A).

Next, the first material film 118 having a thickness of 1 nm to 10 nm is formed over the gate insulating layer 102 (see FIG. 4B).

Next, the crystalline oxide semiconductor film 108 which is thicker than 10 nm is formed over the first material film 118 (see FIG. 4C).

Next, the stack of semiconductor layers including the first material film 118 and the crystalline oxide semiconductor film 108 is processed into an island-shaped stack of semiconductor layers (see FIG. 4D).

The stack of semiconductor layers can be processed by being etched after a mask having a desired shape is formed over the stack of semiconductor layers. The mask may be formed by a method such as photolithography or an ink-jet method.

Note that for the etching of the stack of semiconductor layers, either dry etching or wet etching may be employed. It is needless to say that both of them may be employed in combination.

Next, a conductive film used for forming the source electrode layer and the drain electrode layer (including a wiring formed using the same layer as the source electrode layer and the drain electrode layer) is formed over the stack of semiconductor layers and processed into the source electrode layer 104a and the drain electrode layer 104b.

Next, the insulating film 110a and the insulating film 110b are formed to cover the stack of semiconductor layers, the source electrode layer 104a, and the drain electrode layer 104b (see FIG. 4E). The insulating film 110a is preferably formed using an oxide insulating material and subjected to heat treatment after film formation. By the heat treatment, oxygen is supplied from the insulating film 110a to the stack of semiconductor layers. The heat treatment is performed in an inert atmosphere, an oxygen atmosphere, or a mixed atmosphere of oxygen and nitrogen at a temperature higher than or equal to 200° C. and lower than or equal to 400° C. In addition, heating time of this heat treatment is longer than or equal to 1 minute and shorter than or equal to 24 hours.

Through the above process, the bottom-gate transistor 150 is formed.

The transistor 150 illustrated in FIG. 4E also has a channel region in the crystalline oxide semiconductor film including a crystal having a hexagonal crystal structure in which bonds for forming hexagonal lattices are formed in the a-b plane and the c-axes are substantially perpendicular to a plan surface of the substrate which is substantially parallel to the a-b plane. The transistor 150 has a small amount of change in the threshold voltage between before and after light irradiation or the BT test and thus can have stable electrical characteristics.

This embodiment can be freely combined with Embodiment 1.

(Embodiment 5)

In this embodiment, an example of a structure which is partially different from that described in Embodiment 1 will be described with reference to FIGS. 5A to 5D. Note that in FIGS. 5A to 5D, the same reference numerals are used for the same parts as those in FIGS. 1A to 1E, and description of the parts with the same reference numerals is omitted here.

In Embodiment 1, the example of using a gallium nitride film as the first material film is described; in this embodiment, an example of using another material having a hexagonal crystal structure is described below.

In the case of using an aluminum nitride film which also has a wurtzite crystal structure like a gallium nitride film, the aluminum nitride film does not function as a semiconductor layer but functions as part of a base insulating layer because it is an insulating material.

An $\alpha$-$Al_2O_3$ film which has a corundum crystal structure can also be used. The $\alpha$-$Al_2O_3$ film can be formed by a chemical vapor deposition method. In the case of using the $\alpha$-$Al_2O_3$ film, the $\alpha$-$Al_2O_3$ film also does not function as a semiconductor layer but functions as part of a base insulating layer because it is an insulating material.

Figure 5A:
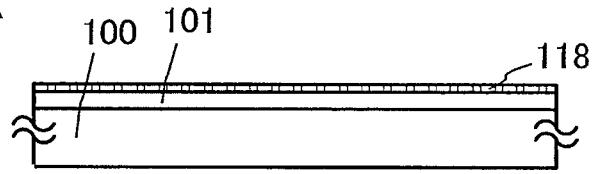
FIGS. 5A to 5D are cross-sectional views and a top view of one embodiment of the present invention.
Figure 5B:
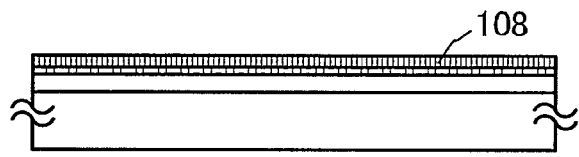
Figure 5C:
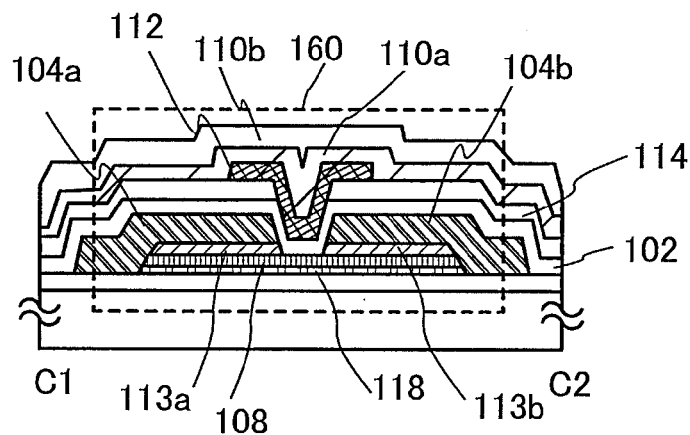
Figure 5D:
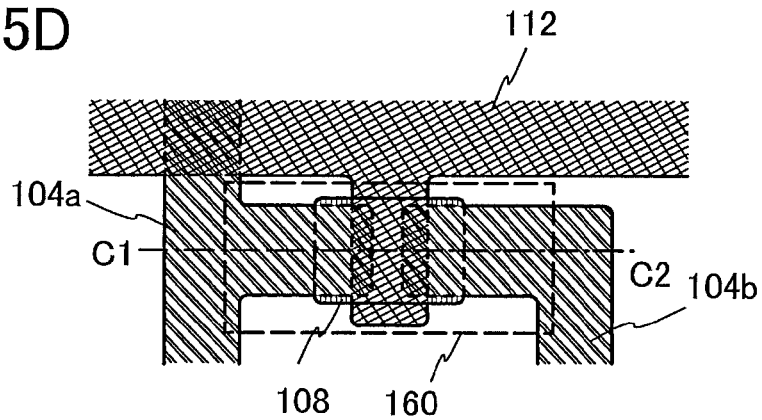
Figure 6A:
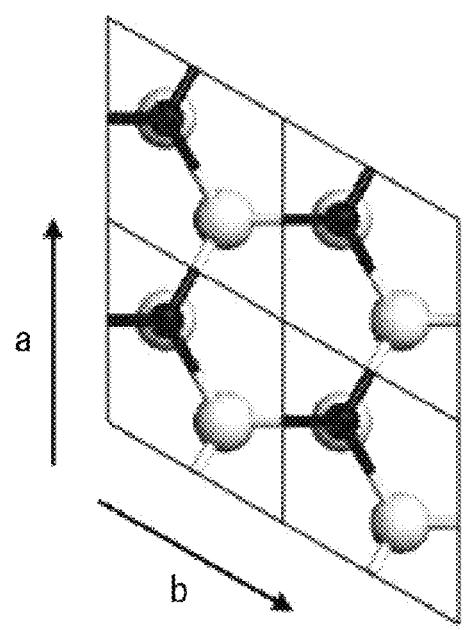
FIGS. 6A and 6B are schematic diagrams of a wurtzite crystal structure.
Figure 6B:
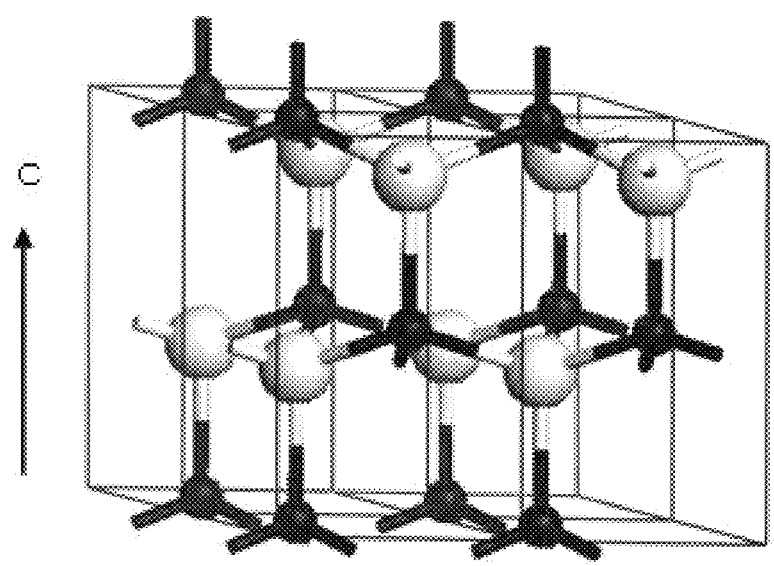
Figure 6B:
Figure 6B:
Figure 7A:
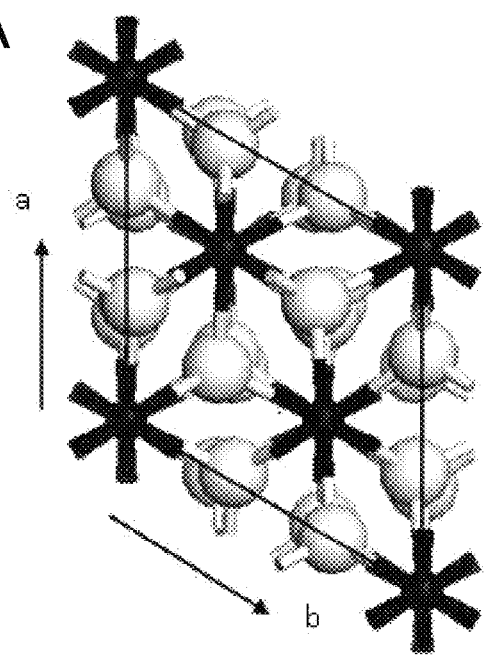
FIGS. 7A and 7B are schematic diagrams of a corundum crystal structure.
Figure 7B:
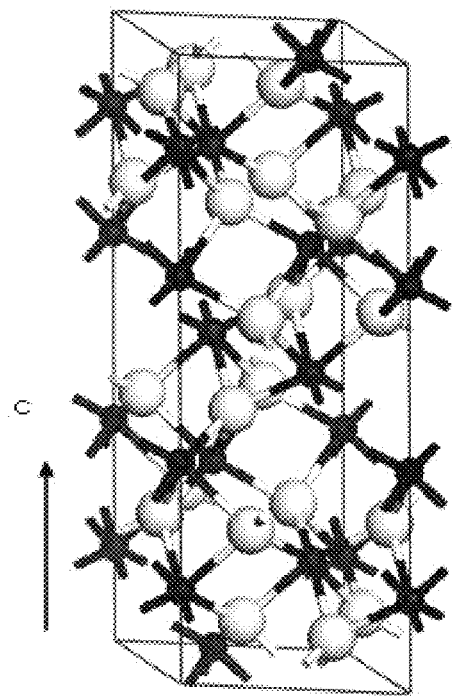

FIG. 5C illustrates a cross-sectional structure of a top-gate transistor 160 and is a cross-sectional view along a dashed line C1-C2 in FIG. 5D which is a top view. The transistor 160 includes, over the substrate 100 having an insulating surface, the oxide insulating layer 101, the first material film 118, the crystalline oxide semiconductor film 108 including a channel formation region, $n^+$ layers 113a and 113b, the source electrode layer 104a, the drain electrode layer 104b, the gate insulating layer 102, the gate electrode layer 112, an insulating layer 114, and the insulating film 110a. The source electrode layer 104a and the drain electrode layer 104b are provided to cover end portions of the crystalline oxide semiconductor film 108 and end portions of the $n^+$ layers 113a and 113b. The gate insulating layer 102 covering the source electrode layer 104a and the drain electrode layer 104b is in contact with part of the crystalline oxide semiconductor film 108. The gate electrode layer 112 is provided over the part of the crystalline oxide semiconductor film 108 with the gate insulating layer 102 interposed therebetween.

The insulating layer 114 overlapping with the source electrode layer 104a and the drain electrode layer 104b is provided over the gate insulating layer 102 in order to reduce parasitic capacitance generated between the gate electrode layer 112 and the source electrode layer 104a and parasitic capacitance generated between the gate electrode layer 112 and the drain electrode layer 104b. Further, the gate electrode layer 112 and the insulating layer 114 are covered with the insulating film 110a, and the insulating film 110b is provided to cover the insulating film 110a.

A process for manufacturing the transistor 160 over the substrate is described below with reference to FIGS. 5A to 5C.

First, the oxide insulating layer 101 is formed over the substrate 100. The oxide insulating layer 101 is formed using a silicon oxide film, a gallium oxide film, an aluminum oxide film, a silicon oxynitride film, an aluminum oxynitride film, or a silicon nitride oxide film.

Next, the first material film 118 having a thickness of 1 nm to 10 nm is formed over the oxide insulating layer 101 (see FIG. 5A).

In this embodiment, a quartz substrate is used as the substrate, and an aluminum nitride film formed by a sublimation method is used as the first material film 118.

Next, the crystalline oxide semiconductor film 108 which is thicker than 10 nm is formed over the first material film 118 (see FIG. 5B).

In this embodiment, the crystalline oxide semiconductor film having a thickness of 25 nm is formed in an oxygen atmosphere, an argon atmosphere, or an atmosphere including argon and oxygen under conditions where a target for an oxide semiconductor (a target for an In—Ga—Zn—O-based oxide semiconductor ($In_2O_3$:$Ga_2O_3$:$ZnO$=1:1:2 [molar ratio])) is used, the distance between the substrate and the target is 170 mm, the substrate temperature is 400° C., the pressure is 0.4 Pa, and the direct-current (DC) power is 0.5 kW.

Then, heat treatment is performed under a condition where the atmosphere of a chamber in which the substrate is set is an atmosphere of nitrogen or dry air. The temperature of the heat treatment is higher than or equal to 400° C. and lower than or equal to 650° C. In addition, heating time of the heat treatment is longer than or equal to 1 minute and shorter than or equal to 24 hours.

Next, a film functioning as an $n^+$ layer and having a thickness of 1 nm to 10 nm is formed using an In—Zn—O-based material, an In—Sn—O-based material, an In—O-based material, or a Sn—O-based material. In addition, $SiO_2$ may be contained in the above material for the $n^+$ layer. In this embodiment, an In—Sn—O film containing $SiO_2$ is formed to a thickness of 5 nm.

Next, the first material film 118, the crystalline oxide semiconductor film 108, and the film functioning as an $n^+$ layer are processed.

Next, a conductive film used for forming the source electrode layer and the drain electrode layer (including a wiring formed using the same layer as the source electrode layer and the drain electrode layer) is formed over the film functioning as an $n^+$ layer and processed into the source electrode layer 104a and the drain electrode layer 104b. Etching is performed when the conductive film is processed or after the conductive film is processed. The film functioning as an $n^+$ layer is selectively etched, whereby the crystalline oxide semiconductor film 108 is partly exposed. Note that selective etching of the film functioning as an $n^+$ layer enables formation of the $n^+$ layer 113a which overlaps with the source electrode layer 104a and the $n^+$ layer 113b which overlaps with the drain electrode layer 104b. End portions of the $n^+$ layers 113a and 113b preferably have a tapered shape.

The source electrode layer 104a and the drain electrode layer 104b can be formed by a sputtering method or the like to have a single-layer structure or a stacked-layer structure using any of metal materials such as molybdenum, titanium, tantalum, tungsten, aluminum, copper, neodymium, and scandium or an alloy material containing any of the above metal materials.

When the $n^+$ layer 113a or 113b is formed between the crystalline oxide semiconductor film 108 and the source electrode layer 104a or the drain electrode layer 104b, the contact resistance can be lower than the contact resistance in the case where the crystalline oxide semiconductor film 108 is in contact with the source electrode layer 104a or the drain electrode layer 104b. In addition, when the $n^+$ layers 113a and 113b are formed, the parasitic capacitance can be reduced, and the amount of change in on-state current (Ion deterioration) by application of a negative gate stress in a BT test can be suppressed.

Next, the gate insulating layer 102 is formed to be in contact with the exposed part of the crystalline oxide semiconductor film 108 and cover the source electrode layer 104a and the drain electrode layer 104b. The gate insulating layer 102 is preferably formed using an oxide insulating material and subjected to heat treatment after film formation. By this heat treatment, oxygen is supplied from the gate insulating layer 102 to the crystalline oxide semiconductor film 108. The heat treatment is performed in an inert atmosphere, an oxygen atmosphere, or a mixed atmosphere of oxygen and nitrogen at a temperature higher than or equal to 200° C. and lower than or equal to 400° C. In addition, heating time of the heat treatment is longer than or equal to 1 minute and shorter than or equal to 24 hours.

Then, an insulating film is formed over the gate insulating layer 102, and part of the insulating film, overlapping with a region where the gate insulating layer 102 is in contact with the crystalline oxide semiconductor film 108, is selectively removed, so that part of the gate insulating layer 102 is exposed.

The insulating layer 114 functions to reduce the parasitic capacitance generated between the source electrode layer 104a and the gate electrode layer 112 formed later or the parasitic capacitance generated between the drain electrode layer 104b and the gate electrode layer 112 formed later. Note that the insulating layer 114 can be formed using silicon oxide, silicon nitride, aluminum oxide, gallium oxide, a mixed material thereof, or the like.

Next, a conductive film is formed over the gate insulating layer 102 and subjected to a photolithography step, so that the gate electrode layer 112 is formed. The gate electrode layer 112 can be formed by a sputtering method or the like to have a single-layer structure or a stacked-layer structure using any of metal materials such as molybdenum, titanium, tantalum, tungsten, aluminum, copper, neodymium, and scandium or an alloy material which contains any of these materials as a main component.

Next, the insulating film 110a and the insulating film 110b are formed to cover the gate electrode layer 112 and the insulating layer 114 (see FIG. 5C).

The insulating film 110a and the insulating film 110b can be formed to have a single-layer structure or a stacked-layer structure using any of silicon oxide, silicon nitride, gallium oxide, silicon oxynitride, silicon nitride oxide, aluminum oxide, aluminum nitride, aluminum oxynitride, aluminum nitride oxide, and hafnium oxide or a mixed material of these.

Through the above process, the top-gate transistor 160 is formed.

The transistor 160 illustrated in FIG. 5C also has a channel region in the crystalline oxide semiconductor film including a crystal having a hexagonal crystal structure in which bonds for forming hexagonal lattices are formed in the a-b plane and the c-axes are substantially perpendicular to a plan surface of the substrate which is substantially parallel to the a-b plane. The transistor 160 has a small amount of change in the threshold voltage between before and after light irradiation or the BT test and thus can have stable electrical characteristics.

This embodiment can be freely combined with any one of Embodiments 1 to 4.

In the case where this embodiment is combined with Embodiment 3 or Embodiment 4 and an aluminum nitride film or an α-$Al_2O_3$ film is used as the first material film, the first material film does not function as a semiconductor layer but functions as part of the gate insulating layer.

(Embodiment 6)

In this embodiment, an example in which at least part of a driver circuit and a transistor to be disposed in a pixel portion are formed over one substrate is described below.

The transistor to be disposed in the pixel portion is formed according to any one of Embodiments 1 to 5. Further, the transistor described in any of Embodiments 1 to 5 is an n-channel TFT, and thus a part of a driver circuit that can be formed with n-channel TFTs among driver circuits is formed over the same substrate as the transistor of the pixel portion.

Figure 9A:
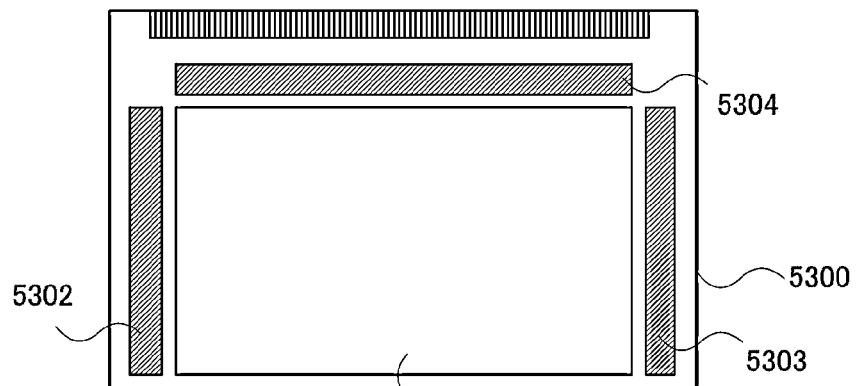
FIGS. 9A to 9C are a block diagram and equivalent circuit diagrams of one embodiment of the present invention.

FIG. 9A is an example of a block diagram of an active matrix display device. Over a substrate 5300 in the display device, a pixel portion 5301, a first scan line driver circuit 5302, a second scan line driver circuit 5303, and a signal line driver circuit 5304 are provided. In the pixel portion 5301, a plurality of signal lines extended from the signal line driver circuit 5304 is arranged and a plurality of scan lines extended from the first scan line driver circuit 5302 and the second scan line driver circuit 5303 is arranged. Note that pixels which include display elements are provided in a matrix in respective regions where the scan lines and the signal lines intersect with each other. Further, the substrate 5300 in the display device is connected to a timing control circuit (also referred to as a controller or a controller IC) through a connection portion such as a flexible printed circuit (FPC).

In FIG. 9A, the first scan line driver circuit 5302, the second scan line driver circuit 5303, and the signal line driver circuit 5304 are formed over the same substrate 5300 as the pixel portion 5301. Accordingly, the number of components such as a drive circuit which are provided outside are reduced, so that reduction in cost can be achieved. Further, if the driver circuit is provided outside the substrate 5300, a wiring would need to be extended and the number of wiring connections would be increased, but if the driver circuit is provided over the substrate 5300, the number of wiring connections can be reduced. Consequently, improvement in reliability and yield can be achieved.

Figure 9B:
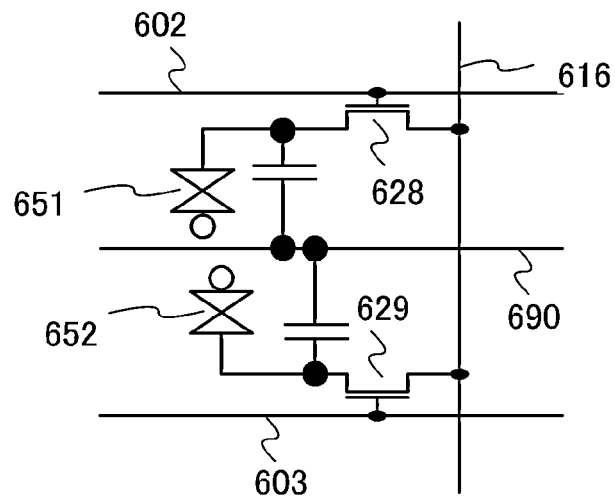

FIG. 9B illustrates an example of a circuit configuration of the pixel portion. Here, a pixel configuration of a VA liquid crystal display panel is described.

In this pixel configuration, a plurality of pixel electrode layers is provided in one pixel, and the pixel electrode layers are connected to respective transistors. The TFTs are constructed so as to be driven with different gate signals. In other words, signals applied to individual pixel electrode layers in a multi-domain pixel are controlled independently.

A gate wiring 602 of a transistor 628 and a gate wiring 603 of a transistor 629 are separated so that different gate signals can be given thereto. In contrast, a source or drain electrode layer 616 functioning as a data line is shared by the transistors 628 and 629. As each of the transistors 628 and 629, any of the transistors described in Embodiments 1 to 5 can be used as appropriate.

A first pixel electrode layer and a second pixel electrode layer which are each electrically connected to the transistor 628 or the transistor 629 have different shapes and are separated by a slit. The second pixel electrode layer is provided so as to surround the external side of the first pixel electrode layer which is spread in a V shape. Timing of voltage application is made to vary between the first and second pixel electrode layers by the transistors 628 and 629 in order to control alignment of the liquid crystal. The transistor 628 is connected to the gate wiring 602, and the transistor 629 is connected to the gate wiring 603. When different gate signals are supplied to the gate wiring 602 and the gate wiring 603, operation timings of the transistor 628 and the transistor 629 can be varied.

Further, a storage capacitor is formed using a capacitor wiring 690, a gate insulating layer functioning as a dielectric, and a capacitor electrode electrically connected to the first pixel electrode layer or the second pixel electrode layer.

The first pixel electrode layer, a liquid crystal layer, and a counter electrode layer overlap with each other to form a first liquid crystal element 651. The second pixel electrode layer, a liquid crystal layer, and a counter electrode layer overlap with each other to form a second liquid crystal element 652. The pixel structure is a multi-domain structure in which the first liquid crystal element 651 and the second liquid crystal element 652 are provided in one pixel.

Note that the pixel structure is not limited to the structure shown in FIG. 9B. For example, a switch, a resistor, a capacitor, a transistor, a sensor, a logic circuit, or the like may be added to the pixel illustrated in FIG. 9B.

Figure 9C:
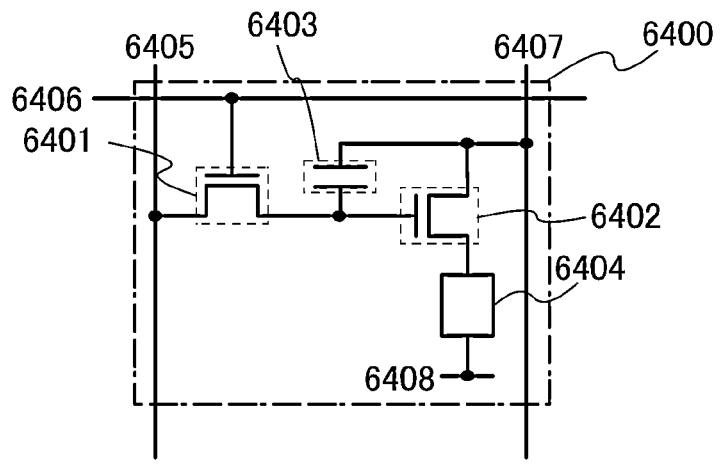

FIG. 9C illustrates another example of a circuit configuration of the pixel portion. Here, a pixel structure of a display panel using an organic EL element is described.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 9C illustrates an example of a pixel configuration to which digital time grayscale driving can be applied as an example of the semiconductor device.

A structure and operation of a pixel to which digital time grayscale driving can be applied are described. Here, one pixel includes two n-channel transistors each of which includes an oxide semiconductor layer as a channel formation region.

A pixel 6400 includes a switching transistor 6401, a driving transistor 6402, a light-emitting element 6404, and a capacitor 6403. A gate electrode layer of the switching transistor 6401 is connected to a scan line 6406, a first electrode (one of a source electrode layer and a drain electrode layer) of the switching transistor 6401 is connected to a signal line 6405, and a second electrode (the other of the source electrode layer and the drain electrode layer) of the switching transistor 6401 is connected to a gate electrode layer of the driving transistor 6402. The gate electrode layer of the driving transistor 6402 is connected to a power supply line 6407 through the capacitor 6403, a first electrode of the driving transistor 6402 is connected to the power supply line 6407, and a second electrode of the driving transistor 6402 is connected to a first electrode (a pixel electrode) of the light-emitting element 6404. A second electrode of the light-emitting element 6404 corresponds to a common electrode 6408. The common electrode 6408 is electrically connected to a common potential line provided over the same substrate.

Note that the second electrode (the common electrode 6408) of the light-emitting element 6404 is set to a low power supply potential. Note that the low power supply potential is a potential that is lower than a high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is higher than or equal to a forward threshold voltage of the light-emitting element 6404.

Note that gate capacitance of the driving transistor 6402 may be used as a substitute for the capacitor 6403, so that the capacitor 6403 can be omitted. The gate capacitance of the driving transistor 6402 may be formed between the channel formation region and the gate electrode layer.

In the case of a voltage-input voltage driving method, a video signal is input to the gate electrode layer of the driving transistor 6402 so that the driving transistor 6402 is in either of two states of being sufficiently turned on and turned off. That is, the driving transistor 6402 operates in a linear region. In order for the driving transistor 6402 to operate in a linear region, a voltage higher than the voltage of the power supply line 6407 is applied to the gate electrode layer of the driving transistor 6402. Note that a voltage higher than or equal to (the voltage of the power supply line+Vth of the driving transistor 6402) is applied to the signal line 6405.

In the case of performing analog grayscale driving instead of digital time grayscale driving, the same pixel configuration as FIG. 9C can be employed by inputting signals in a different way.

In the case of performing analog grayscale driving, a voltage greater than or equal to the sum of the forward voltage of the light-emitting element 6404 and Vth of the driving transistor 6402 is applied to the gate electrode layer of the driving transistor 6402. The forward voltage of the light-emitting element 6404 indicates a voltage at which a desired luminance is obtained, and includes at least forward threshold voltage. Note that the video signal by which the driving transistor 6402 operates in a saturation region is input, so that current can be supplied to the light-emitting element 6404. In order for the driving transistor 6402 to operate in the saturation region, the potential of the power supply line 6407 is set higher than the gate potential of the driving transistor 6402. When an analog video signal is used, it is possible to supply current to the light-emitting element 6404 in accordance with the video signal and perform analog grayscale driving.

Note that the pixel configuration is not limited to that illustrated in FIG. 9C. For example, a switch, a resistor, a capacitor, a sensor, a transistor, a logic circuit, or the like may be added to the pixel illustrated in FIG. 9C.

(Embodiment 7)

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the display device described in the above embodiment will be described.

Figure 10A:
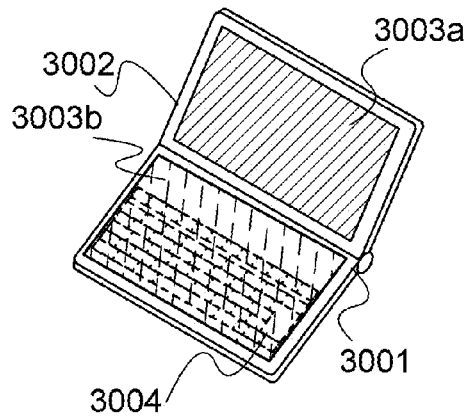
FIGS. 10A to 10D are external views of electronic devices of one embodiment of the present invention.

FIG. 10A illustrates a portable information terminal, which includes a main body 3001, a housing 3002, display portions 3003a and 3003b, and the like. The display portion 3003b functions as a touch panel. By touching a keyboard 3004 displayed on the display portion 3003b, a screen can be operated and text can be input. Needless to say, the display portion 3003a may function as a touch panel. A liquid crystal panel or an organic light-emitting panel is manufactured by using the transistor described in Embodiment 1 as a switching element and applied to the display portion 3003a or 3003b, whereby a highly reliable portable information terminal can be provided.

The portable information terminal in FIG. 10A can have a function of displaying a variety of information (e.g., a still image, a moving image, and a text image) on the display portion, a function of displaying a calendar, a date, the time, or the like on the display portion, a function of operating or editing information displayed on the display portion, a function of controlling processing by various kinds of software (programs), and the like. Moreover, an external connection terminal (e.g., an earphone terminal, a USB terminal, or the like), a recording media insertion portion, or the like may be provided on a rear surface or a side surface of the housing.

The portable information terminal illustrated in FIG. 10A may be configured to be able to transmit and receive data wirelessly. The portable information terminal can have a structure where desired book data or the like are wirelessly purchased and downloaded from an electronic book server.

Figure 10B:
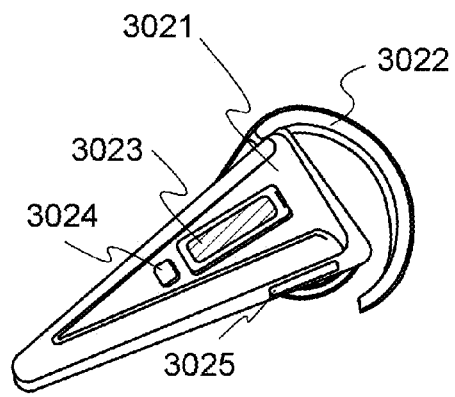

FIG. 10B illustrates a portable music player, which includes, in a main body 3021, a display portion 3023, a fixing portion 3022 with which the portable music player can be worn on the ear, a speaker, an operation button 3024, an external memory slot 3025, and the like. A liquid crystal panel or an organic light-emitting panel is manufactured by using the transistor described in Embodiment 1 as a switching element and applied to the display portion 3023, whereby a highly reliable portable music player can be provided.

Furthermore, when the portable music player illustrated in FIG. 10B has an antenna, a microphone function, or a wireless communication function and is used with a mobile phone, a user can talk on the phone wirelessly and hands-free while driving a car or the like.

Figure 10C:
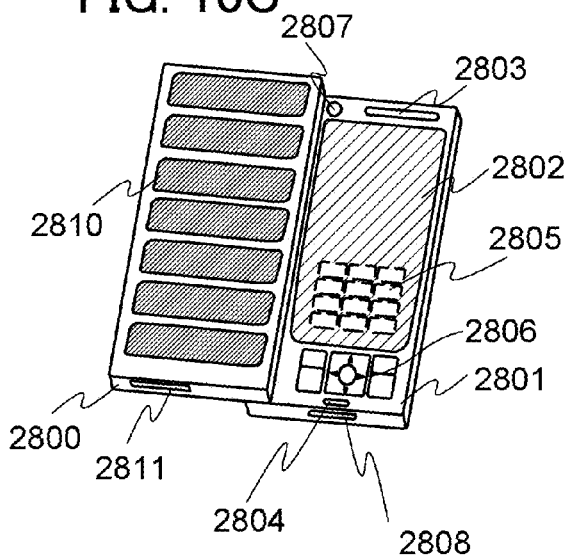

FIG. 10C illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the portable information terminal, an external memory slot 2811, and the like. Further, an antenna is incorporated in the housing 2801. The transistor described in Embodiment 1 is applied to the display panel 2802, whereby a highly reliable mobile phone can be provided.

Further, the display panel 2802 includes a touch panel. A plurality of operation keys 2805 which are displayed as images are indicated by dashed lines in FIG. 10C. Note that a boosting circuit by which a voltage output from the solar cell 2810 is increased to be sufficiently high for each circuit is also included.

For example, a power transistor used for a power supply circuit such as a boosting circuit can also be formed when the crystalline oxide semiconductor film 108 of the transistor 120 described in Embodiment 1 has a thickness of 2 μm to 50 μm.

The display panel 2802 changes the orientation of display as appropriate in accordance with the application mode. Further, the camera lens 2807 is provided on the same side as the display panel 2802, so that the mobile phone can be used as a video phone. The speaker 2803 and the microphone 2804 can be used for videophone calls, recording, and playing sound, etc. as well as voice calls. Moreover, the housings 2800 and 2801 in a state where they are developed as illustrated in FIG. 10C can be slid so that one is lapped over the other. Therefore, the size of the mobile phone can be reduced, which makes the mobile phone suitable for being carried around.

The external connection terminal 2808 can be connected to an AC adaptor and a variety of cables such as a USB cable, and charging and data communication with a personal computer or the like are possible. Moreover, the mobile phone can store and transfer a larger amount of data by inserting a recording medium into the external memory slot 2811.

Further, in addition to the above functions, an infrared communication function, a television reception function, or the like may be provided.

Figure 10D:
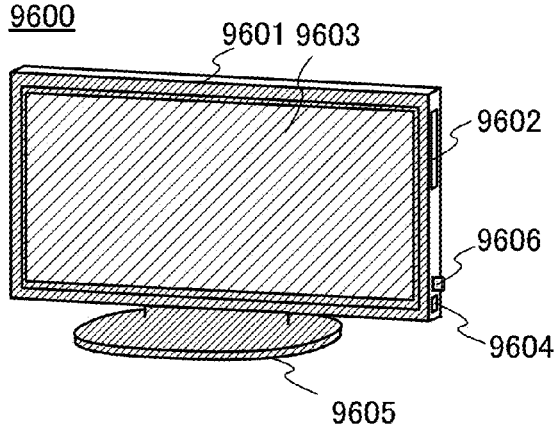
Figure 11:
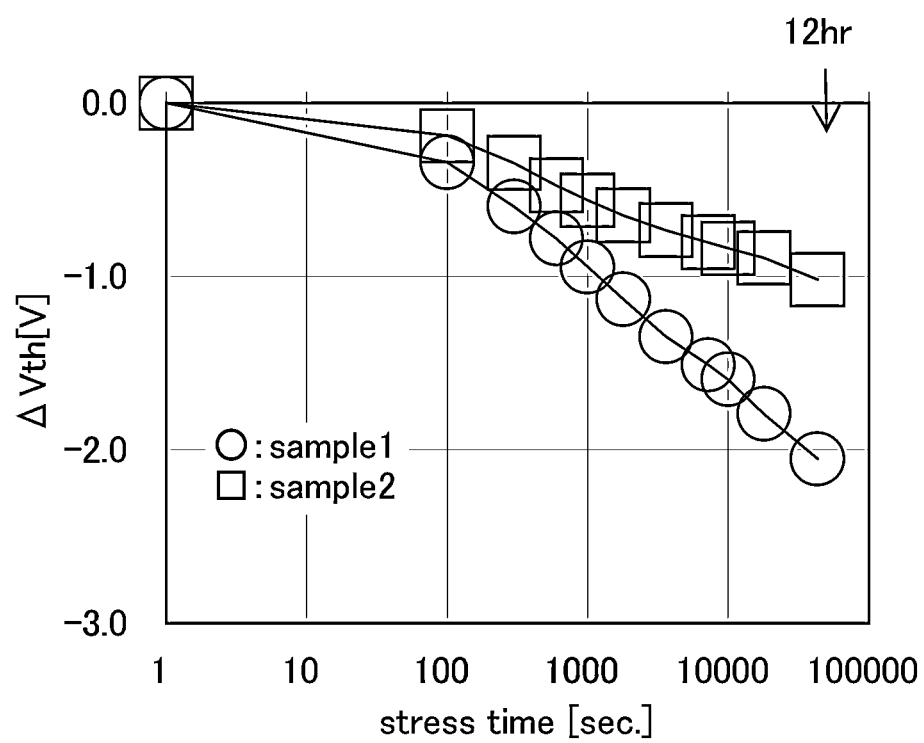
FIG. 11 is a graph for describing negative-bias temperature stress.
Figure 12A:
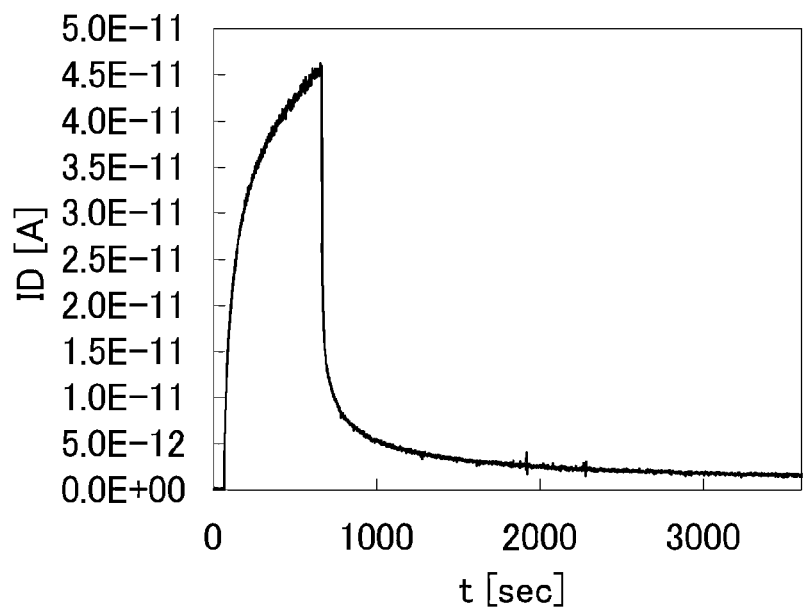
FIGS. 12A and 12B are graphs for describing time dependence of photocurrent.
Figure 12B:
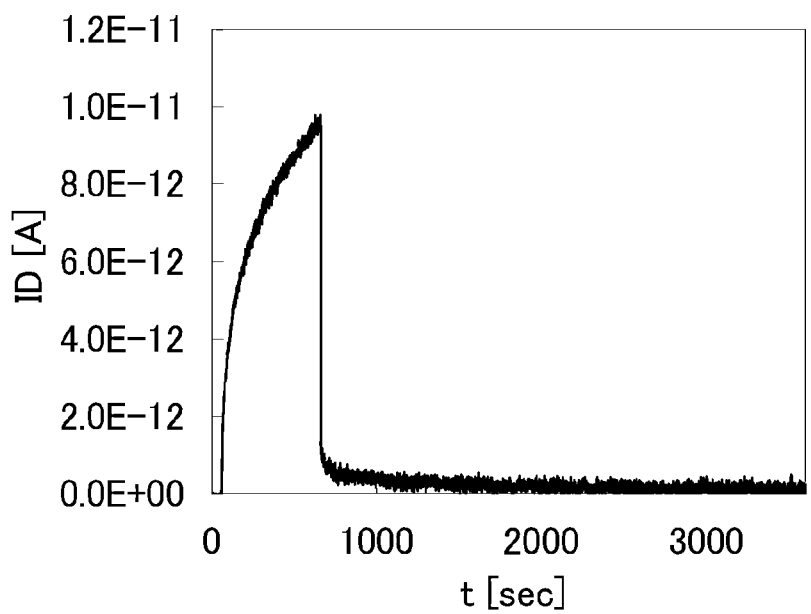
Figure 13:
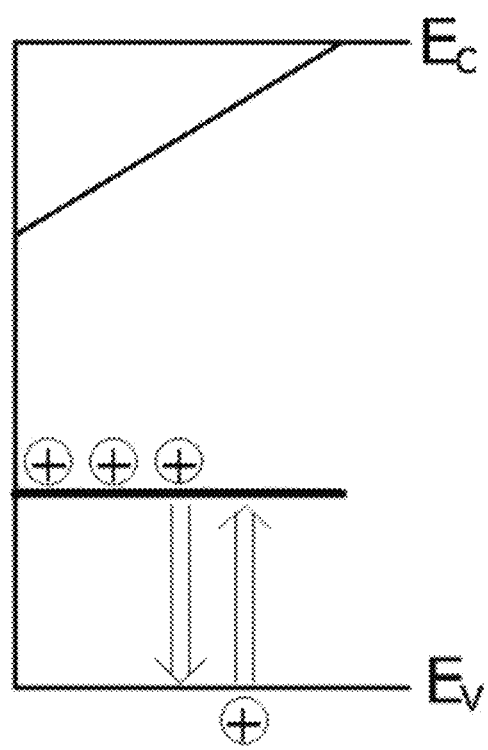
FIG. 13 is a schematic diagram showing a donor level.
Figure 14:
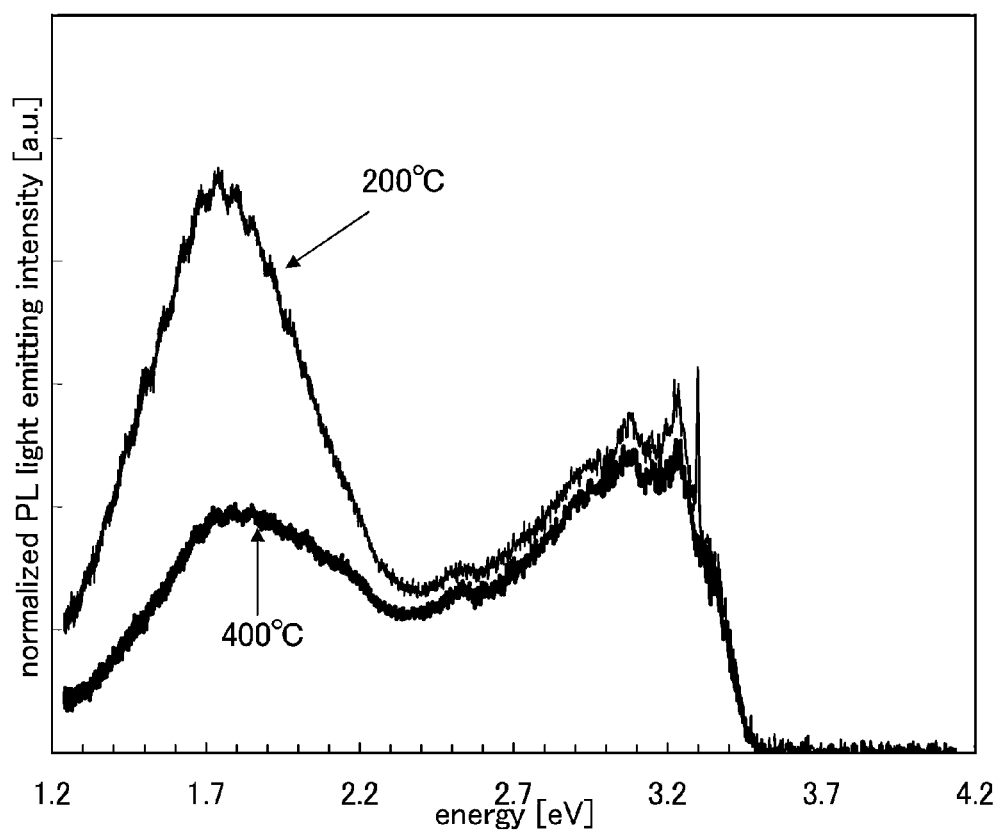
FIG. 14 is a graph showing measurement results of low-temperature PL.
Figure 15A:
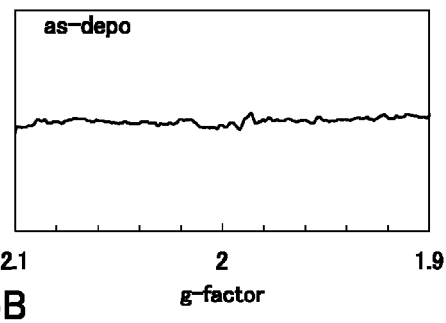
FIGS. 15A to 15C are graphs showing results of ESR measurement.
Figure 15B:
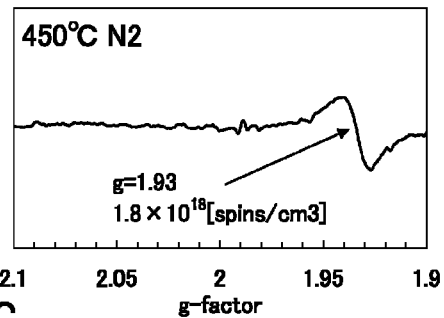
Figure 15C:
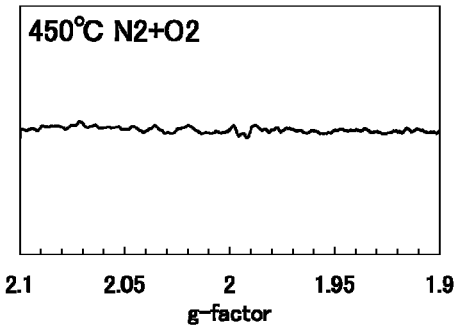
Figure 16:
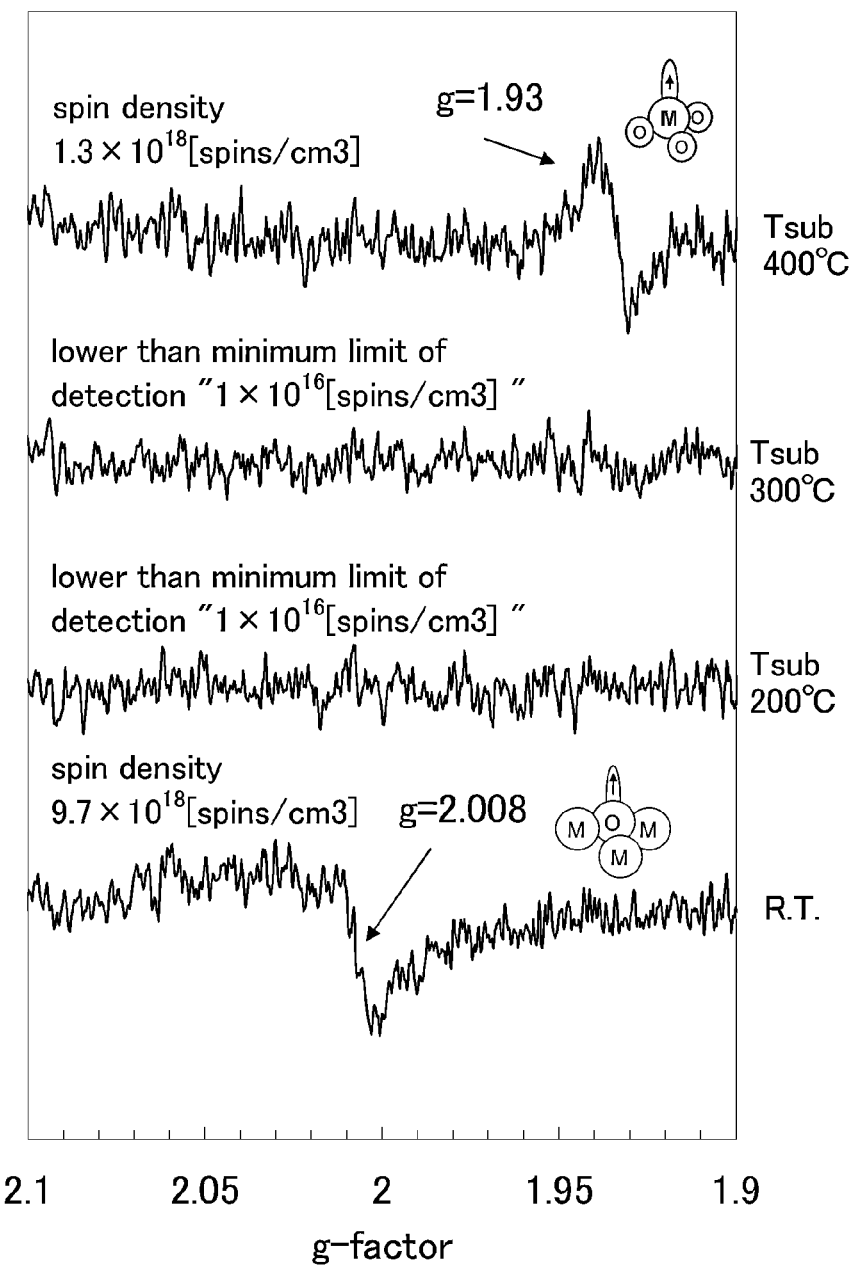
FIG. 16 is a graph showing results of ESR measurement.
Figure 17:
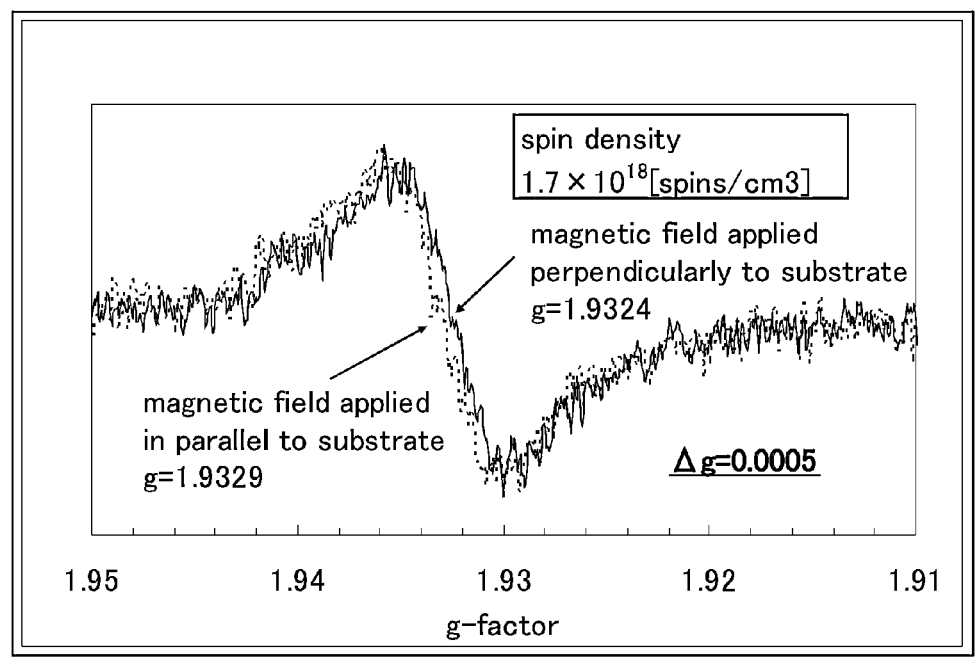
FIG. 17 is a graph showing results of ESR measurement.
Figure 18:
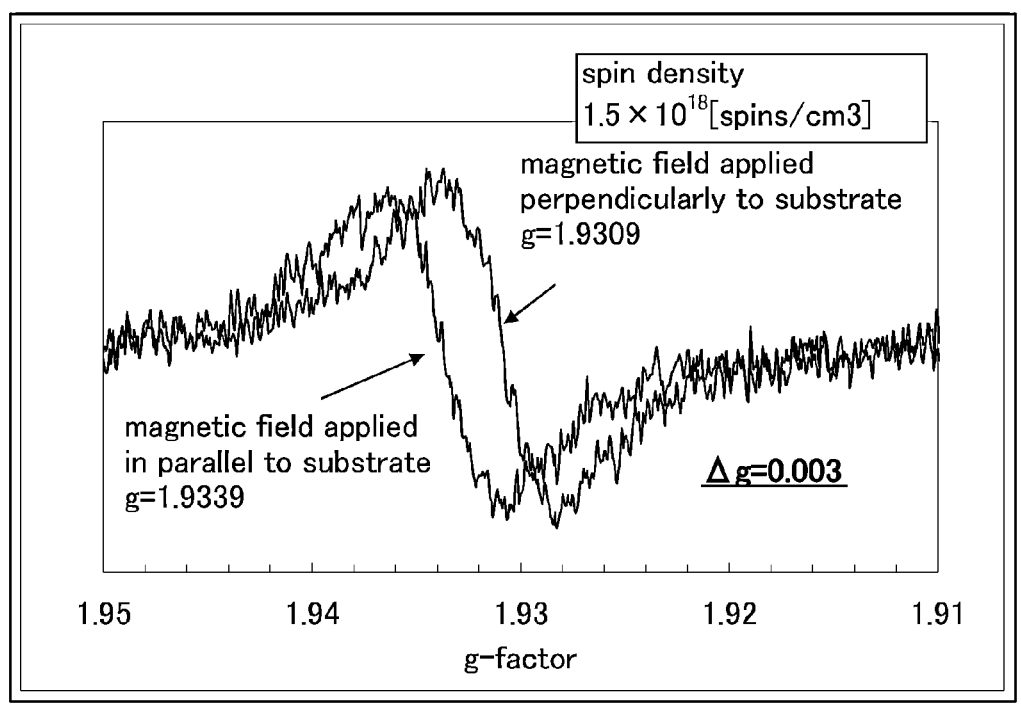
FIG. 18 is a graph showing results of ESR measurement
Figure 19:
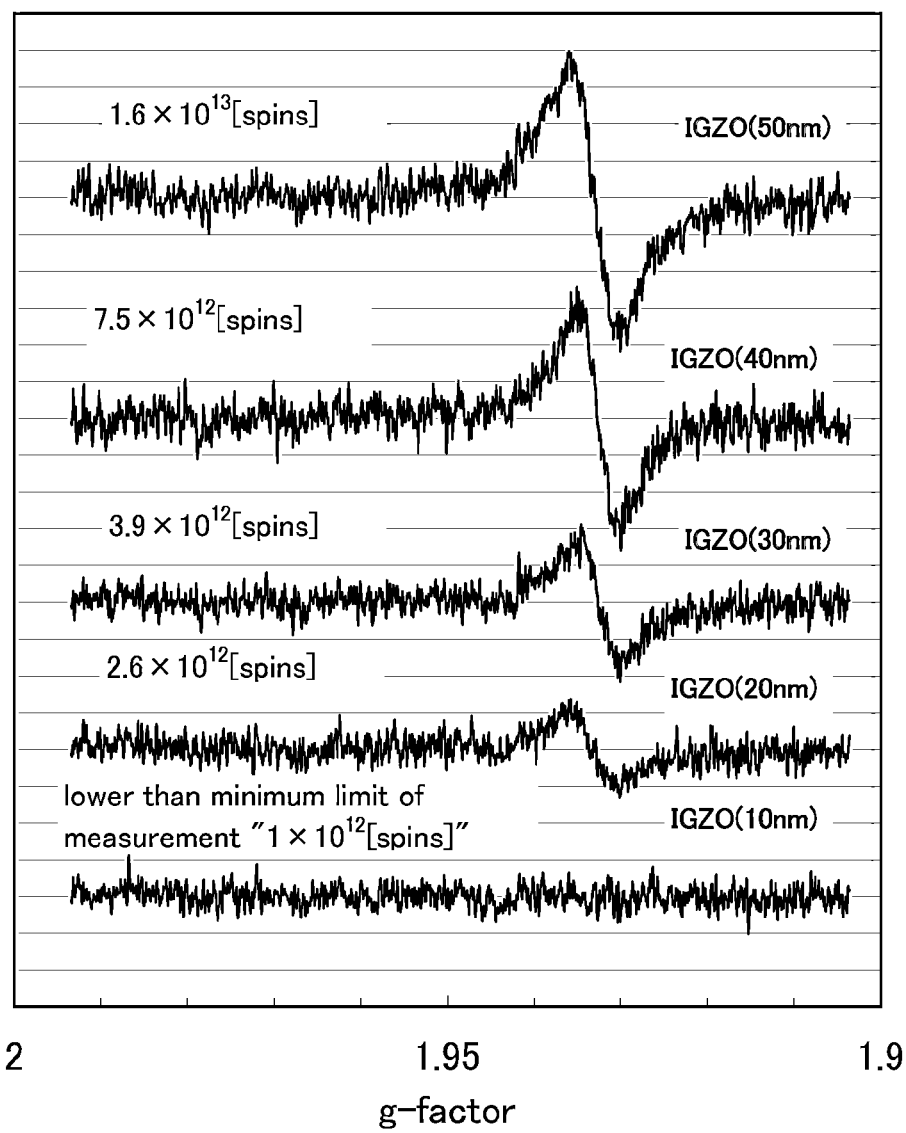
FIG. 19 is a graph showing results of ESR measurement.
Figure 20:
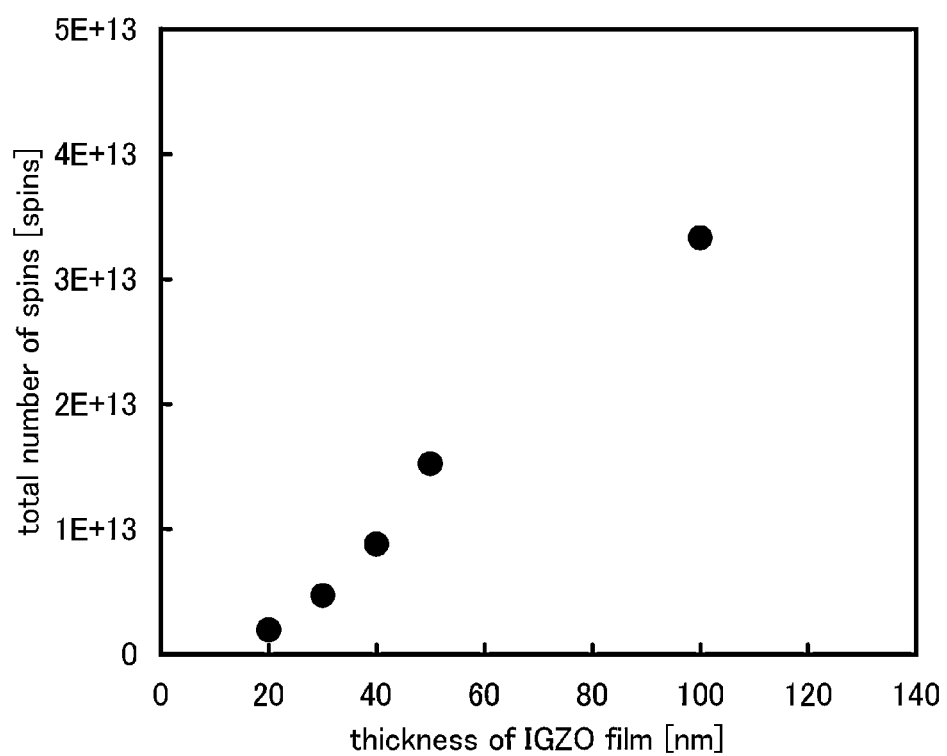
FIG. 20 is a graph showing the relationship between the total number of spins obtained by ESR measurement and the thickness of an oxide semiconductor layer.

FIG. 10D illustrates an example of a television set. In a television set 9600, a display portion 9603 is incorporated in a housing 9601. The display portion 9603 can display images. Here, the housing 9601 is supported on a stand 9605 incorporating a CPU. When the transistor described in Embodiment 1 is applied to the display portion 9603, the television set 9600 with high reliability can be obtained.

The television set 9600 can be operated with an operation switch of the housing 9601 or a separate remote controller. Further, the remote controller may be provided with a display portion for displaying data output from the remote controller.

Note that the television set 9600 is provided with a receiver, a modem, and the like. With the use of the receiver, the television set 9600 can receive general television broadcasting. Moreover, when the television set is connected to a communication network with or without wires via the modem, one-way (from a sender to a receiver) or two-way (between a sender and a receiver or between receivers) information communication can be performed.

Further, the television set 9600 is provided with an external connection terminal 9604, a storage medium recording and reproducing portion 9602, and an external memory slot. The external connection terminal 9604 can be connected to various types of cables such as a USB cable, and data communication with a personal computer is possible. A disk storage medium is inserted into the storage medium recording and reproducing portion 9602, and reading data stored in the storage medium and writing data to the storage medium can be performed. In addition, a picture, a video, or the like stored as data in an external memory 9606 inserted to the external memory slot can be displayed on the display portion 9603.

This application is based on Japanese Patent Application serial no. 2010-204968 filed with Japan Patent Office on Sep. 13, 2010, the entire contents of which are hereby incorporated by reference.

What is claimed is:

1. A semiconductor device comprising:
   a first material film having a hexagonal crystal structure over an insulating surface;
   a second material film having a hexagonal crystal structure on and in contact with the first material film;
   a gate insulating layer over the second material film;
   an insulating layer over the gate insulating layer, the insulating layer comprising an opening portion; and
   a gate electrode layer over the insulating layer, the gate electrode layer being in contact with the gate insulating layer through the opening portion;
   wherein the second material film is thicker than the first material film.

2. The semiconductor device according to claim 1, wherein the first material film comprises gallium oxide or aluminum oxide.

3. The semiconductor device according to claim 1, wherein the first material film comprises α-$Al_2O_3$, α-$Ga_2O_3$, $In_2O_3$, $Ti_2O_3$, $V_2O_3$, $Cr_2O_3$, or α-$Fe_2O_3$.

4. The semiconductor device according to claim 1, wherein the second material film comprises zinc, indium, or gallium.

5. The semiconductor device according to claim 1, further comprising an n+ layer over the second material film, a source electrode and a drain electrode over the n+ layer.

6. The semiconductor device according to claim 1, further comprising an insulating layer over the gate electrode layer.

7. The semiconductor device according to claim 1, wherein the gate insulating layer comprises silicon oxide, silicon oxynitride, silicon nitride oxide, aluminum oxide, aluminum oxynitride, or aluminum nitride oxide.

8. A semiconductor device comprising:
a first insulating layer over a substrate;
an oxide semiconductor layer over the first insulating layer;
a second insulating layer over the oxide semiconductor layer;
a third insulating layer over the second insulating layer, the third insulating layer comprising an opening portion; and
a gate electrode layer over the third insulating layer, the gate electrode layer being in contact with the second insulating layer through the opening portion,
wherein the first insulating layer has a corundum crystal structure.

9. The semiconductor device according to claim 5, wherein the n+ layer comprises indium oxide, indium zinc oxide, tin oxide, or indium tin oxide.

10. The semiconductor device according to claim 8, further comprising an n+ layer over the oxide semiconductor layer, a source electrode and a drain electrode over the n+ layer.

11. The semiconductor device according to claim 8, wherein the first insulating layer comprises aluminum nitride or aluminum oxide.

12. The semiconductor device according to claim 8, wherein the oxide semiconductor layer comprises zinc, indium, or gallium.

13. The semiconductor device according to claim 8, further comprising an insulating layer over the gate electrode layer.

14. The semiconductor device according to claim 10, wherein the n+ layer comprises indium oxide, indium zinc oxide, tin oxide, or indium tin oxide.

15. The semiconductor device according to claim 8, wherein the second insulating layer comprises silicon oxide, silicon oxynitride, silicon nitride oxide, aluminum oxide, aluminum oxynitride, or aluminum nitride oxide.

16. A semiconductor device comprising:
a first oxide semiconductor layer over a substrate;
a second oxide semiconductor layer over the first oxide semiconductor layer;
a third oxide semiconductor layer over the second oxide semiconductor layer;
a first insulating layer over the third oxide semiconductor layer;
a second insulating layer over the first insulating layer, the second insulating layer comprising an opening portion; and
a gate electrode layer over the second insulating layer, the gate electrode layer being in contact with the first insulating layer through the opening portion,
wherein the first oxide semiconductor layer has a corundum crystal structure.

17. The semiconductor device according to claim 16, wherein the first oxide semiconductor layer comprises gallium oxide.

18. The semiconductor device according to claim 16, wherein the second oxide semiconductor layer comprises zinc, indium, or gallium.

19. The semiconductor device according to claim 16, further comprising a source electrode and a drain electrode over the third oxide semiconductor layer.

20. The semiconductor device according to claim 16, wherein the third oxide semiconductor layer comprises indium oxide, indium zinc oxide, tin oxide, or indium tin oxide.

* * * * *